United States Patent
Choi et al.

(10) Patent No.: US 9,557,547 B2
(45) Date of Patent: Jan. 31, 2017

(54) PARAXIAL CLOAK DESIGN AND DEVICE

(71) Applicants: Joseph S. Choi, Rochester, NY (US); John C. Howell, Rochester, NY (US)

(72) Inventors: Joseph S. Choi, Rochester, NY (US); John C. Howell, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 14/714,671

(22) Filed: May 18, 2015

(65) Prior Publication Data

US 2016/0025956 A1   Jan. 28, 2016

Related U.S. Application Data

(60) Provisional application No. 62/028,658, filed on Jul. 24, 2014.

(51) Int. Cl.
| | |
|---|---|
| G02B 17/00 | (2006.01) |
| G02B 1/00 | (2006.01) |
| G02B 17/08 | (2006.01) |
| G02B 27/00 | (2006.01) |
| G06F 17/50 | (2006.01) |

(52) U.S. Cl.
CPC ............ *G02B 17/008* (2013.01); *G02B 1/007* (2013.01); *G02B 17/08* (2013.01); *G02B 27/0012* (2013.01); *G06F 17/50* (2013.01)

(58) Field of Classification Search
CPC ................................ G02B 7/007; G02B 17/08
USPC .................... 359/726–731, 733–735
See application file for complete search history.

(56) References Cited

U.S. PATENT DOCUMENTS

| | | | |
|---|---|---|---|
| 4,288,148 A | 9/1981 | Offner | |
| 5,307,162 A | 4/1994 | Schowengerdt | |
| 2003/0227415 A1* | 12/2003 | Joannopoulos | B82Y 20/00 343/754 |
| 2006/0171032 A1* | 8/2006 | Nishioka | B82Y 20/00 359/566 |
| 2009/0310231 A1* | 12/2009 | Maekawa | G02B 1/007 359/733 |

(Continued)

OTHER PUBLICATIONS

Chanda et al., "Large-area flexible 3d optical negative index metamaterial formed by nanotransfer printing," Nat. Nanotechnol. 6, 402-407 (2011).

(Continued)

*Primary Examiner* — Darryl J Collins
(74) *Attorney, Agent, or Firm* — Kilpatrick Townsend & Stockton, LLP

(57) ABSTRACT

A paraxial cloaking device provides a cloaking volume in which an item can be hid from view. A cloaking device includes an optical input receiving light rays and an optical output from which a continuous range of directions of the received light rays exit the paraxial cloaking device. The cloaking volume being disposed between the optical input and the optical output. For received light rays having incoming directions non-parallel to the reference optical axis up to a first angle, each of the received light rays exits the cloaking device substantially aligned with the respective received light ray and does not pass through the cloaking volume. The paraxial cloaking device has a unity magnification factor. In some instances, the paraxial cloaking device includes a phase matching element.

29 Claims, 21 Drawing Sheets

(56) References Cited

U.S. PATENT DOCUMENTS

| 2009/0316279 | A1* | 12/2009 | Bowers | B82Y 20/00 |
| | | | | 359/754 |
| 2010/0265552 | A1* | 10/2010 | Wang | B82Y 20/00 |
| | | | | 359/9 |
| 2012/0268836 | A1* | 10/2012 | Mercado | G02B 17/0852 |
| | | | | 359/731 |

OTHER PUBLICATIONS

Chen, eta al., "Ray-Optics Cloaking Devices for Large Objects in Incoherent Natural Light" Nature Communications, 2013, 4: 1-6.
Chen, et al., "Macroscopic Invisibility Cloaking of Visible Light" Nature Communications, 2011, 2: 1-6.
Chen et al., "Extending the bandwidth of electromagnetic cloaks," Phys. Rev. B 76, 241104 (2007).
Choi et al., "Paraxial Full-Field Cloaking", The Institute of Optics, 2014.
Choi et al., "Paraxial ray optics cloaking," Opt. Express 22, 29465-29478 (2014).
Clark, "1990 International Lens Design Conference Lens Design Problems: the design of a NonLens", SPIE, 1990, 1354: 558-569.
Collins, "Lens-system diffraction integral written in terms of matrix optics," J. Opt. Soc. Am. 60, 1168-1177 (1970).
Costa et al., "Achromatic lens based on a nanowire material with anomalous dispersion," Opt. Express 20, 13915-13922 (2012).
Devaney, "Nonuniqueness in the Inverse Scattering Problem", J. Mathematical Physics, 1978, 19: 1526.
Duan et al., "Geometric optics-based multiband cloaking of large objects with the wave phase and amplitude preservation," Opt. Express 22, 27193-27202 (2014).
Ergin et al. "Three-dimensional invisibility cloak at optical wavelengths," Science 328, 337-339 (2010).
Fleury et al., "Cloaking and invisibility: a review," Prog. Electrornagn. Res. 147, 171-202 (2014).
Fridman, "Demonstration of Temporal Cloaking", Nature, 2012, 481: 62-65.
Gbur, "Invisibility Physics: Past, Present Future", Progress in Optics, 2013, 58:65-114 (2013).
Greenleaf et al., "Anisotropic conductivities that cannot be detected by EIT," Physiol. Meas. 24,413-419 (2003).
Greenleaf et al., "Full-wave invisibility of active devices at all frequencies, " Commun. Math. Phys. 275, 749-789 (2007).
Greenleaf et al., "Isotropic transformation optics: approximate acoustic and quantum cloaking," New J. Phys. 10, 115024 (2008).
Hashemi et al., "Diameter-bandwidth product limitation of isolated-object cloaking," Phys. Rev. A 86, 013804 (2012).
Howell, "Amplitude-only, Passive, Broadband, Optical Spatial Cloaking of Very Large Optics", Applied Optics, 2014, 53: 1958-1963.
Kildishev et al., "Transformation optics: approaching broadband electromagnetic cloaking," New J. Phys. 10, 115029 (2008).
Leonhardt, "Optical Conformal Mapping", Science, 2006, 312: 1777-1780.
Leonhardt et al., Broadband invisibility by non-euclidean cloaking, Science 32 110-112 (2009).
Li et al., "Hiding under the Carpet: A New Strategy for Cloaking" Physical Review Letters, 2008 101: 1-4.
Ma, et al., "Experiments on active cloaking and illusion for laplace equation," Phys. Rev. Lett. 111, 173901 (2013).
McCall, "Transformation Optics and Cloaking", Contemporary Physics 54: 273-286 , (2013).
Miller, "On perfect cloaking," Opt. Express 14, 12457-12466 (2006).
Monticone et al., "Physical bounds on electromagnetic invisibility and the potential of superconducting cloaks," Photonics Nanostruct. 12, 330-339 (2014).
Monticone et al., "Do cloaked objects really scatter less?" Phys. Rev. X 3, 041005 (2013).
Nachman, "Reconstructions from Boundary Measurements", Annals of Mathematics, 1988, 128: 531-576.
Pendry et al., "Controlling Electromagnetic Fields" Science, 2006, 312:1780-1782.
Shelby et al., "Experimental verification of a negative index of refraction," Science 292, 77-79 (2001).
Silveirinha, "Anomalous refraction of light colors by a metamaterial prism," Phys. Rev. Left. 102, 193903 (2009).
Soukoulis et al., "Past achievements and future challenges in the development of three-dimensional photonic metamaterials," Nat. Photonics 5, 523-530 (2011).
Theisen et al., "Optical Properties of Gallium Implanted Silicon," in Frontiers in Optics 2012/Laser Science XXVIII, OSA Technical Digest (online) (Optical Society of America, 2012), p. FTu4A.3.
Valentine et al., "Three-dimensional optical metamaterial with a negative refractive index," Nature 455, 376-379 (2008).
Veselago, "Electrodynamics of substances with simultaneously negative values of sigma and mu," Phys.-Usp. 10, 509-514 (1968).
Wolf et al., "Invisible bodies and uniqueness of the inverse scattering problem," Journal of Modern Optics, 40:785-792 , 1993.
Zhang et al., "Macroscopic Invisibility Cloak for Visible Light", Physical Review Letters, 2011, 106: 033901-1-033901-4.

* cited by examiner

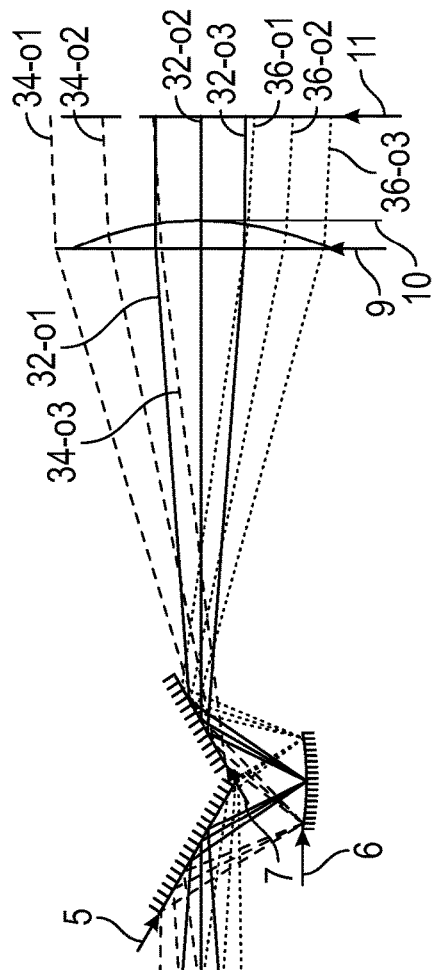
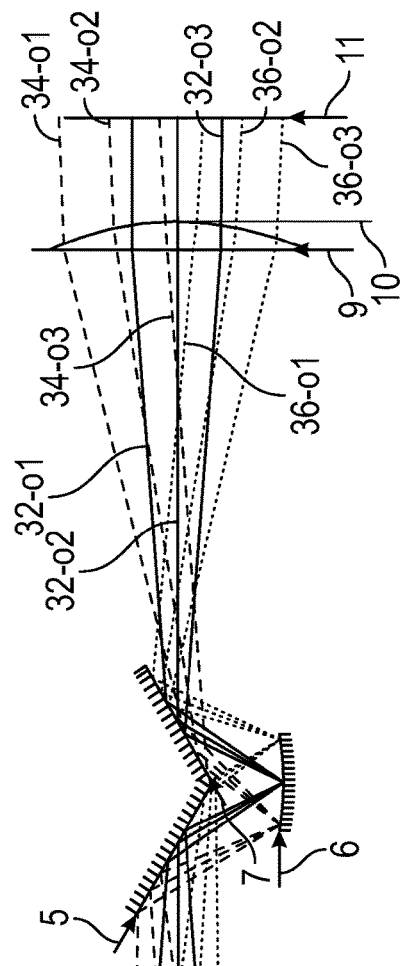
FIG. 4
FIG. 5

PARAXIAL CLOAK DESIGN AND DEVICE

CROSS-REFERENCE TO RELATED APPLICATIONS

This patent application claims priority to U.S. application Ser. No. 62/028,658 filed on Jul. 24, 2014 for a "Paraxial Cloak Design and Device," the entire content of which is hereby incorporated by this reference.

STATEMENT AS TO RIGHTS TO INVENTIONS MADE UNDER FEDERALLY SPONSORED RESEARCH AND DEVELOPMENT

This work was supported by the Army Research Office Grant No. W911 NF-12-1-0263 and the DARPA DSO Grant No. W31P4Q-12-1-0015. The government has certain rights in the invention.

BACKGROUND

Optical spatial cloaking has captured the imagination of both the popular culture and scientific communities (see, e.g., Gbur, G. Invisibility physics: Past, present, and future. Progress in Optics 58, 65-114 (2013)). Seminal works in optical spatial cloaking includes work by Leonhardt (Leonhardt, U. Optical conformal mapping. Science 312, 1777-1780 (2006)) and Pendry, Schurig, and Smith (Pendry, J. B., Schurig, D. & Smith, D. R. Controlling electromagnetic fields. Science 312, 1780-1782 (2006)). These seminal works provide a theoretical framework to create a curved space for light waves, by carefully constructing materials in Cartesian space. This new field of research has been called 'transformation optics' (McCall, M. Transformation optics and cloaking Contemporary Physics 54, 273-286 (2013)). Experimental realization of such transformational optics has been difficult, due to the previously perceived need for artificial electric and magnetic materials (called 'metamaterials'), the narrow-band spectrum involved, infinite phase velocity (or negative index to compensate this), and anisotropy in the theory (Gbur, G. Invisibility physics: Past, present, and future. Progress in Optics 58, 65-114 (2013)). Nonetheless, inspired by transformation optics, there have been some advances in optical spatial cloaking. These advances include a two-dimensional microwave cloak (Schurig, D. et al. Metamaterial electromagnetic cloak at microwave frequencies. Science 314, 977-980 (2006)); a 'carpet cloak' that hides an object under a surface (Li, J. S. & Pendry, J. B. Hiding under the carpet: A new strategy for cloaking Physical Review Letters 101, 203901 (2008)); and even cloaking in time (Fridman, M., Farsi, A., Okawachi, Y. & Gaeta, A. L. Demonstration of temporal cloaking Nature 481, 62-65 (2012)), and (Lukens, J. M., Leaird, D. E. & Weiner, A. M. A temporal cloak at telecommunication data rate. Nature 498, 205-208 (2013)). A few groups have been able to cloak millimeter- to centimeter-sized objects as well, using birefringent materials (Zhang, B. L., Luo, Y. A., Liu, X. G. & Barbastathis, G. Macroscopic invisibility cloak for visible light. Physical Review Letters 106, 033901 (2011)), and (Chen, X. Z. et al. Macroscopic invisibility cloaking of visible light. Nature Communications 2, 176 (2011)).

To overcome the metamaterial requirements (in some implementations) and to extend cloaking to a broadband, visible regime for large objects, researchers have recently looked to ray optics for cloaking (see, e.g., Chen, H. et al. Ray-optics cloaking devices for large objects in incoherent natural light. Nature Communications 4, 2652 (2013); Zhai, T. R., Ren, X. B., Zhao, R. K., Zhou, J. & Liu, D. H. An effective broadband optical 'cloak' without metamaterials. Laser Physics Letters 10, 066002 (2013); and Howell, J. C., Howell, J. B. & Choi, J. S. Amplitude-only, passive, broadband, optical spatial cloaking of very large objects. Applied Optics 53, 1958-1963 (2014)). In these cloaks, the amplitude and direction of light fields are considered, as opposed to the full preservation of fields (amplitude and phase) of transformation optics. These designs have been able to cloak centimeter to meter-sized objects with commonly available optics. Yet, these schemes work only for unidirectional incident light, as they are not designed for continuous multidirectional cloaking, and can have non-unity magnifications. For off-axis, non-zero angles, the background images show distortion and positional shifts. This is particularly true if the background is far away from the cloaking device. In addition, as seen in FIG. 1 of Howell, J. C., Howell, J. B. & Choi, J. S. Amplitude-only, passive, broadband, optical spatial cloaking of very large objects. Applied Optics 53, 1958-1963 (2014), rays that propagate through the system, but go through the center at non-zero angles, can actually enter the cloaking region, effectively uncloaking the space.

Despite the advances in cloaking, a 3-D multidirectional cloak has been elusive. As shown by Wolf and Habashy (Wolf, E. & Habashy, T. Invisible bodies and uniqueness of the inverse scattering problem. Journal of Modern Optics 40, 785-792 (1993)) and Nachman (Nachman, A. I. Reconstructions from boundary measurements Annals of Mathematics 128, 531-576 (1988)), no isotropic cloaking scheme can hide an object from all viewing angles. Their work answered a question that stemmed from Devaney (Devaney, A. J. Nonuniqueness in inverse scattering problem. Journal of Mathematical Physics 19, 1526-1531 (1978)), who elegantly showed how to mathematically construct potentials that have zero scattering fields, and are hence invisible. Devaney's result, however, was for a finite number of discrete directions, and not for a continuous range of angles.

BRIEF SUMMARY

The following presents a simplified summary of some non-limiting embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

Paraxial cloaking devices and related methods, as described herein, provide a cloaking volume by which an object can be hidden from view relative to a continuous range of viewing directions. The cloaking devices described herein can be constructed with readily available off-the-shelf isotropic optical components, such as lenses and mirrors, thereby negating the need for any artificial electric and/or magnetic materials (i.e., metamaterials) in at least some implementations. Such devices have potential usages in many different fields, for example, in secure communications, transportation, military applications, and medical devices.

In one non-limiting embodiment, a paraxial cloaking device having a cloaking volume and a reference optical axis is provided. The cloaking device includes an optical input receiving incoming light rays and an optical output from which a plurality of the light rays exit the paraxial cloaking device. The optical output is offset along the optical axis from the optical input. The cloaking volume is disposed between the optical input and the optical output. For light rays having incoming directions that are non-parallel to the reference optical axis up to a first angle between the incoming light ray and the reference optical axis, each of the light rays exits the cloaking device substantially aligned with the respective incoming light ray and does not pass through the cloaking volume. The paraxial cloaking device has a unity magnification factor (i.e., the cloaking device does not affect the apparent size of the objects in the image to the viewer).

In some instances, a paraxial cloaking device hides the cloaking volume for viewing directions that are significantly off-axis. For example, in some instances, the first angle is up to 3.5 degrees, up to 5 degrees, or even up to 15 degrees or more.

In some instances, a paraxial cloaking device imparts an optical transformation to the received light rays defined by an ABCD matrix, wherein A=1, B=L/n, C=0, and D=1; L being a length between the optical input and the optical output, and n being an index of refraction for the surrounding/ambient medium, before and/or after, the cloaking device.

Various configurations of a paraxial cloaking devices are possible. For example, in some instances a paraxial cloaking device includes a first lens, a first mirror, a second mirror, a third mirror, and a second lens. The first and second lenses are centered on the reference optical axis. The first and third mirrors are tilted relative to the reference optical axis. The second mirror is curved. The optical input includes the first lens. The optical output includes the second lens. A light ray passing through the cloaking device follows an optical propagation path. The second mirror is disposed along the optical propagation path between the first and second lenses. The first mirror is disposed along the optical propagation path between the first lens and the second mirror. And the third mirror is disposed along the optical propagation path between the second mirror and the second lens. The first and second lenses can have the same focal length. The first lens and the first mirror can be separated by a distance equal to a distance separating third mirror and the second lens. And the first mirror and the second mirror can be separated a distance equal to a distance separating the second mirror and the third mirror.

As another example, in some instances a paraxial cloaking device includes a first lens, a first mirror, a second lens, a second mirror, a third lens, a third mirror, and a fourth lens. The first and fourth lenses are centered on the reference optical axis. The first and third mirrors are tilted relative to the reference optical axis. The optical input includes the first lens. The optical output includes the fourth lens. A light ray passing through the cloaking device follows an optical propagation path. The second mirror is disposed along the optical propagation path between the first and fourth lenses. The first mirror is disposed along the optical propagation path between the first lens and the second mirror. The third mirror is disposed along the optical propagation path between the second mirror and the fourth lens. The second lens is disposed along the optical path between the first and second mirror. And the third lens is disposed along the optical path between the second and third mirrors. The first and fourth lenses can have the same focal length. The first lens and the first mirror can be separated by a distance equal to a distance separating third mirror and the fourth lens. The first mirror and the second lens can be separated a distance equal to a distance separating the third lens and the third mirror. The second and third lenses can have the same focal length. And the second lens and the second mirror can be separated a distance equal to a distance separating the second mirror and the third lens.

As another example, a paraxial cloaking device can be rotationally symmetric and includes three or more lenses. For example, a rotationally symmetric cloaking device can include three or more lenses that are centered on the reference optical axis. As another example, a rotationally symmetric cloaking device can include four or more lenses that are centered on the reference optical axis. At least one of the lenses can include an achromatic doublet to reduce aberrations.

In another non-limiting embodiment, a related method of designing a cloaking device is disclosed. The method includes selecting and positioning optical components of a candidate cloaking device and calculating an ABCD matrix for the candidate cloaking device. The optical components are selected and positioned such that A=1, B=L/n, C=0, and D=1; L being a length between the optical input and the optical output, n being an index of refraction for the surrounding/ambient medium, before and/or after, the cloaking device. In some instances, the method further includes adjusting at least one of a parameter or a position of at least one of the optical components of the candidate cloaking device so as to compensate for a thickness of at least one of the optical components of the candidate cloaking device. In some instances, the method further includes tracing at least one ray through the candidate cloaking device to assess a deviation between the location and direction of the ray prior to being received by the candidate cloaking device and after exiting the candidate cloaking device, and adjusting at least one of a parameter and a position of at least one of the optical components of the candidate cloaking device based on the deviation assessment so as to reduce the deviation.

In another non-limiting embodiment, a method for designing a cloaking device having a desired cloaking volume is disclosed. Such a method can include selecting any suitable cloaking device as described herein to be scaled to provide the desired cloaking volume. A scale factor indicative of a size difference between the desired cloaking volume and the cloaking volume of the selected cloaking device is determined. Configuration parameters of the second cloaking device are determined by scaling corresponding configuration parameters of the selected cloaking device by the scale factor.

In some instances, the paraxial cloaking devices described herein can be constructed from readily available existing optical components, for example, lenses and mirrors. In some instances, a paraxial cloaking device does not include a metamaterial (e.g., artificial electric and/or magnetic material) optical component. And in some instances, a paraxial cloaking device does not include a non-isotropic optical component. In other instances, a paraxial cloaking device does include a metamaterial.

In some instances, the cloaking device includes a metamaterial optical component.

In some instances, the cloaking device further includes a phase matching element. The phase matching element may be in some instances a flat plate having at least one index of refraction and a longitudinal length. The phase matching element may be in some instances an anomalous dispersion element. The phase matching element may be or include a metamaterial in some instances. The phase matching element may have a negative index of refraction in some instances.

BRIEF DESCRIPTION OF THE DRAWINGS

FIG. 4 illustrates a ray tracing assessment performed on a cloaking device in accordance with the cloaking device of FIG. 3.

FIG. 5 illustrates a ray tracing assessment performed on an optimized cloaking device in accordance with the cloaking device of FIG. 3.

DETAILED DESCRIPTION

In the following description, some non-limiting embodiments of the present invention will be described. For purposes of explanation, specific configurations and details are set forth in order to provide a thorough understanding of the embodiments. It will, however, also be apparent to one skilled in the art that the present invention may be practiced without the specific details. Furthermore, well-known features may be omitted or simplified in order not to obscure the embodiment being described.

In some instances, the paraxial cloaking devices disclosed herein require no new materials (e.g., artificial electric and/or magnetic materials—"metamaterials"), use isotropic off-the-shelf optics, scale easily to cloak relatively large objects, and are as broadband as the choice of optical material, all of which have been challenges for previous cloaking schemes. In addition, a concise formalism is provided that quantifies and produces optical cloaks that can be used to cloak an object with respect to a small-angle ('paraxial') limit. To a first approximation, the paraxial cloaking devices disclosed herein accurately replicate the ambient space.

Characterizing a Paraxial Optical Spatial Cloak

Figure 1A:
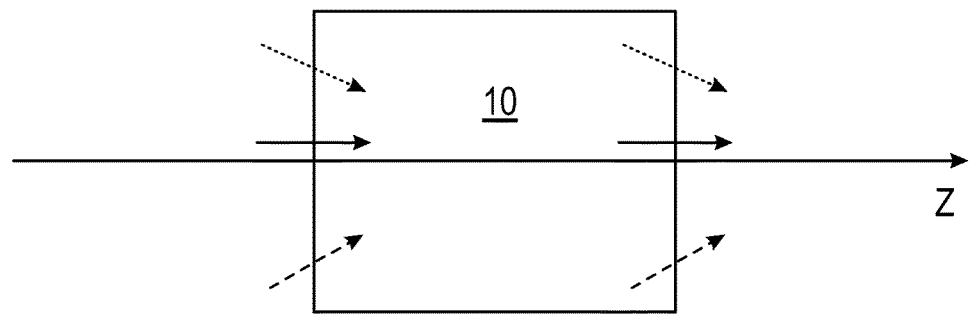
FIGS. 1A and 1B are simplified diagrammatic illustrations of an 'identity' optical transformation.
Figure 1B:
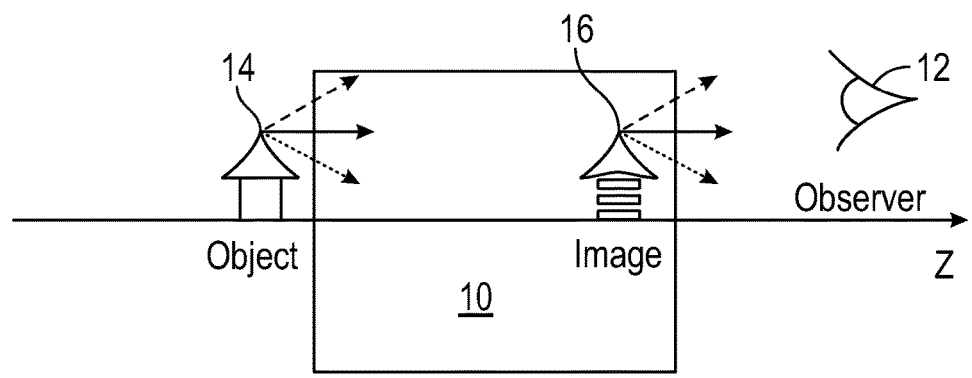
Figure 1C:
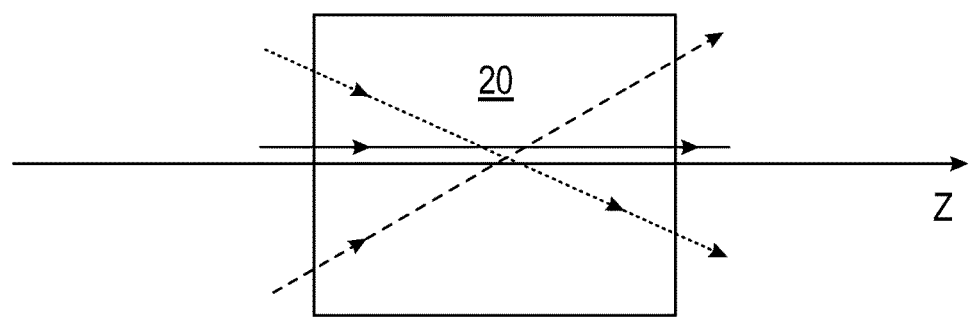
FIG. 1C is a simplified diagrammatic illustration of an optical transformation of a paraxial cloaking device, in accordance with some instances.

Referring now to the drawings, in which like reference numerals represent like parts throughout the several views, FIGS. 1A through 1C schematically illustrate possible candidate for ray-based optical spatial cloaking FIG. 1A illustrates an identity transformation, in which rays entering an identity transformation black box 10 from the left and exit to the right with the same positions and directions. FIG. 1B illustrates how an observer 12 would view an object 14 disposed behind the identity transformation black box 10. To the observer 12, the object 14 would appear to be closer than its actual position, by the length of the box, and therefore appear to be located at image 16. Although the identity transformation is a good candidate for ray-based optical spatial cloaking, an ideal cloaking device would make objects behind the cloaking device appear to be exactly where they are. In other words, an ideal cloaking device should act the same way as if it was filled with the surrounding medium. For example, to cloak in air, the cloaking device should act as it was filled with air. FIG. 1C schematically illustrates an example 'ideal' cloaking device 20.

We can then define an 'ideal cloak' for ray optics—it contains a non-zero volume to hide an object, and it behaves as if its entire space was replaced by the surrounding medium, for all light rays entering it.

ABCD Matrix

Figure 2:
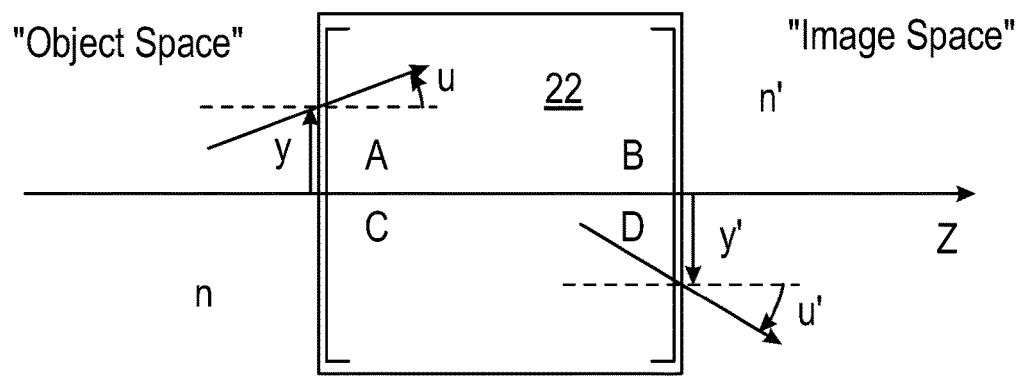
FIG. 2 is a simplified diagrammatic illustration of an optical transformation.

The characteristics of the cloaking devices described herein can be quantified and defined with the aid of linear equations. Referring now to FIG. 2, to a first approximation, also referred to herein as the "paraxial approximation," light rays are assumed to deviate minimally from the axis of rotational symmetry for the system (z in FIG. 2). In the paraxial approximation, as indicated in equation (1) below, ray angles are assumed to be small. Each light ray can be described by its position y and the paraxial angle u, much like an object is described by position and momentum.

$$u = \tan \theta \approx \theta, \quad (1)$$

For the above case, it is assumed that the system is rotationally symmetric about the z-axis. Theta (θ) in equation (1) is the angle of the light ray from the z-axis.

Because of the linearity of optics in the paraxial approximation, the propagation of light rays through an optical system can be described by matrices. These matrices are referred to herein as 'ray transfer' matrices, or 'ABCD' matrices. Equation (2) below shows how an ABCD matrix is used.

$$\begin{bmatrix} y' \\ n'u' \end{bmatrix} = \begin{bmatrix} A & B \\ C & D \end{bmatrix} \begin{bmatrix} y \\ nu \end{bmatrix}, \quad (2)$$

In equation (2), n and n' are the indices of refraction for the space before and after the optical system, respectively (See FIG. 2, where rays travel from left to right). The ABCD matrix defines the transformation accomplished on the light rays by the optical system (e.g., optical system 22 schematically represented in FIG. 2). The ABCD matrix maps the initial position (y) and angle (u) of incoming light rays to corresponding light rays exiting the system (y', u'). The space before the optical system (represented mathematically by the ABCD matrix) is referred to herein as the "object space" with index of refraction n. In a similar fashion, the space after the optical system is referred to herein as the "image space" with index of refraction n'. In FIG. 2, y>0, u>0, y'<0, and u'<0, with the sign convention used. The ABCD matrix for a space of length t, with index of refraction $n_t$, is shown in equation (3) below.

$$M_t = \begin{bmatrix} 1 & t/n_t \\ 0 & 1 \end{bmatrix}. \quad (3)$$

In some instances of a paraxial cloaking device, the ABCD matrix is as set forth in equation (3) above, where t=L is the length of the optical system, and $n_t$=n=n'. This is because a paraxial cloaking device should replicate the surrounding medium throughout its volume. Substituting into equation (3) yields equation (4).

$$\begin{bmatrix} y' \\ nu' \end{bmatrix} = \begin{bmatrix} 1 & L/n \\ 0 & 1 \end{bmatrix} \begin{bmatrix} y \\ nu \end{bmatrix} = \begin{bmatrix} y + Lu \\ nu \end{bmatrix} \quad (4)$$

In equation (4), the angle of the exiting light ray is set equal to the angle of the incoming light ray and the position y of the light ray shifts by the angle multiplied by the length (i.e., y'=y+Lu). Equation (4) sets forth the optical transformation for a paraxial optical cloaking system that applies to all light rays that would be seen by an observer, at least within the accuracy associated with the first order of approximation set forth above. Equation (4) is compatible with the findings of Wolf and Habashy (E. Wolf and T. Habashy, Journal of Modern Optics 40, 785 (1993)) and Nachman (A. I. Nachman, Annals of Mathematics 128, 531 (1988)) since Equation (4) is based on the paraxial approximation described above, and hence not applicable at large angles. Equation (4), however, has been shown to set forth an effective condition, despite its conciseness. For clarity, the ABCD matrix of equation (4) is restated below in equation (5).

$$\begin{bmatrix} A & B \\ C & D \end{bmatrix}_{ideal\ cloak} = \begin{bmatrix} 1 & L/n \\ 0 & 1 \end{bmatrix}, \quad (5)$$

In equation (5), L and n are the length of the cloaking system and index of refraction of the surrounding medium, respectively. Because ABCD matrices have a determinant of 1, equation (5) gives only three conditions to be satisfied:

$$B = L/n, C = 0, \text{ and } (A=1 \text{ or } D=1). \quad (6)$$

Note that the cloaking system per equation (4) is "afocal" (C=0). Afocal optical systems have no net focusing power, so, for example, an object at infinity will be imaged to infinity. This aspect is helpful when designing a cloaking system satisfying equation (4), since an afocal condition can be easily checked.

Example Paraxial Optical Spatial Cloaks

Figure 3:
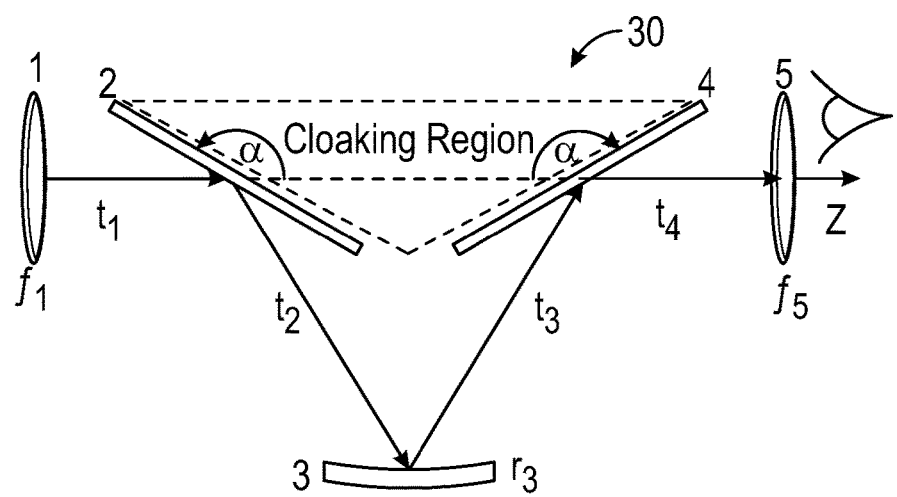
FIG. 3 is a simplified diagrammatic illustration of a paraxial cloaking device, in accordance with some instances.

FIG. 3 illustrates a first example of a paraxial cloak 30, in accordance with some instances. The paraxial cloak 30 contains a non-zero volume to hide an object, and satisfies equation (5) with corrected signs to include the mirrors (See equation (8)). While only the on-axis ray is shown (thick arrows), the paraxial cloak 30 also works for off-axis rays from other possible ray directions and positions, at least with respect to off-axis directions within the small angle assumption used to formulate equation (5).

Figure 29:
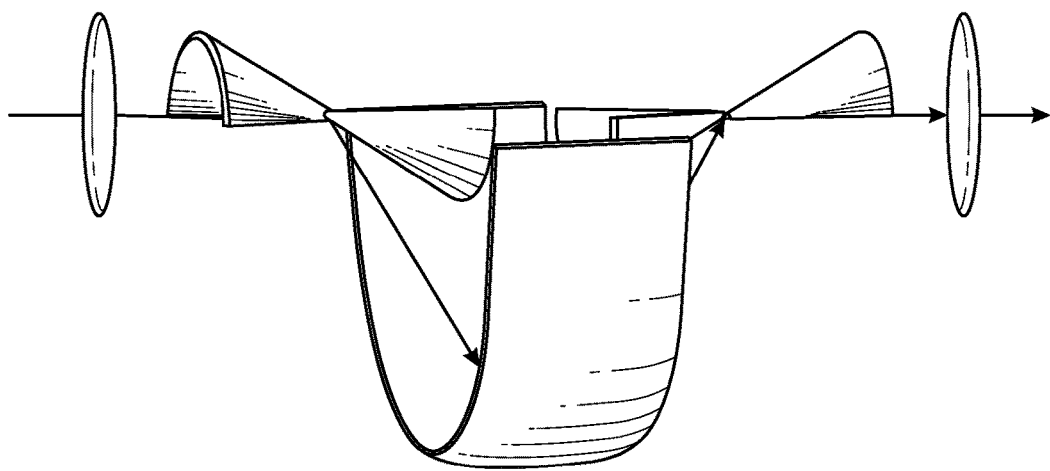
FIG. 29 is a simplified diagram of a three-dimensional adaptation of the two-dimensional cloak shown in FIG. 3.

The paraxial cloak 30 works for two-dimensions. To make it work for off-axis angles in three-dimensions, the device can be manufactured by rotating the two-dimensional design by a full 180 degrees about the dotted line that connects the centers of lenses 1 and 5 in FIG. 3 (So each layer should replicate this two-dimensional design throughout the 180 degrees; mirrors 2 and 4 will be shaped similar to bowties (two half-cones attached), mirror 3 will be shaped as a toroidal shell, and the lenses will remain spherical). This is shown in FIG. 29.

For simplicity, the paraxial cloak 30 is in air, with the index of refraction of air ($n_{air}$) set to 1. The ABCD Matrix for the paraxial cloak 30 is given in equation (7).

$$\begin{bmatrix} 1 & 0 \\ 1/f_5 & 1 \end{bmatrix} \cdot \begin{bmatrix} 1 & -t_4 \\ 0 & 1 \end{bmatrix} \cdot \begin{bmatrix} 1 & t_3 \\ 0 & 1 \end{bmatrix}. \quad (7)$$

$$\begin{bmatrix} 1 & 0 \\ \frac{-2}{r_3} & 1 \end{bmatrix} \cdot \begin{bmatrix} 1 & -t_2 \\ 0 & 1 \end{bmatrix} \cdot \begin{bmatrix} 1 & t_1 \\ 0 & 1 \end{bmatrix} \cdot \begin{bmatrix} 1 & 0 \\ -1/f_1 & 1 \end{bmatrix}.$$

In equation (7), the t's are the longitudinal distances (along the bent z-axis) between each optical element, the f's are the focal lengths, and $r_3$ is the radius of curvature of the center mirror (See FIG. 3). The four thick arrows in FIG. 3 follow the path of an on-axis ray. Note that equation (7) is based on a thin lens approximation. Also, the z-axis follows the thick arrows, since this is the center axis of symmetry.

Care must be given to use the correct signs for each of the terms in equation (7), so as to remain consistent. Otherwise, the correct solution space will not be found. One sign convention that can be used is set forth in D. Buralli, OPT 441—Geometrical Optics (The Institute of Optics, University of Rochester, Rochester, N.Y., U.S.A., 2010), where after odd number of reflections the propagation distance t and the index of refraction n change signs. With this convention, the space in which light exits (to the far-right) has index of refraction $n_5=-n_{air}=-1$ and the y-axis also changes signs (by carefully considering propagation directions). Incorporating this sign convention into equation (4) for the paraxial cloak 30 yields equation (8).

$$\begin{bmatrix} y' \\ -u' \end{bmatrix} = \begin{bmatrix} -1 & -L \\ 0 & -1 \end{bmatrix} \begin{bmatrix} y \\ u \end{bmatrix} = \begin{bmatrix} -(y+Lu) \\ -u \end{bmatrix}. \quad (8)$$

In some instances, a paraxial cloak is configured to undo any changes that the first half of the paraxial cloak makes on the light rays. By doing so, the rays may retain the same direction, similar to a retro-reflector. This can be done by making the second half of the paraxial cloak 30 symmetric to the first half (i.e., $f_5=-f_1$, $t_4=-t_1$, $t_3=-t_2$). As a result, $f_1$ can be solved for as shown in equation (9) such that A=−1 for the ABCD matrix.

$$f_1 = t_1 - t_2. \quad (9)$$

Serendipitously, this is the same condition that sets C=0. As noted above, D=−1 is automatically satisfied. Equation (9) shows that requiring a paraxial cloak to have symmetric halves is helpful in some instances.

With $f_1$ set to equation (9), the ABCD matrix for a paraxial cloak simplifies to:

$$\begin{bmatrix} -1 & 2(t_1-t_2)(r_3-t_1+t_2)/r_3 \\ 0 & -1 \end{bmatrix}. \quad (10)$$

The radius of curvature of the center mirror, r3, can then be determined so as to satisfy the remaining condition: B=−L. Using the geometry of the paraxial cloak 30 shown in FIG. 3 yields an overall device length per equation (11).

$$L = 2(t_1 - t_2 \sin(2\alpha - 3\pi/2)). \quad (11)$$

Solving for r3 yields:

$$r_3 = -\frac{(t_1 - t_2)^2}{-2t_1 + t_2 + t_2 \cos(2\alpha)}. \quad (12)$$

Notably, if $r_3=f_1$, then B=0. It can be seen that such an optical system can either be an identity transformation or a cloaking system.

Only equations (9) and (12) need to be met for the optical system 30 to be an ideal paraxial cloak. For example, with a lens with $f_1=200$ mm, mirror 2 tilt angle $\alpha=150$ degrees, and $t_2=-40$ mm, $t_1$ and $r_3$ can be solved for yielding $t_1=160$ mm and $r_3=105.3$ mm. The net length of the system 30 is L=360 mm.

Using these values, light rays within and beyond the small angle paraxial approximation were traced using CODE V, which uses Snell's Law directly and accurately simulates light rays in actual lenses. FIG. 4 shows the simulation results. For the simulation, $t_1$ was obtained by subtracting $|t_2|$ from the back focal length of the lens used, to properly account for the lens thickness (so $t_1 \approx 150$ mm). The simulation showed that incoming on-axis rays 32-i1, 32-i2, 32-i3 are un-deviated relative to their respective outgoing rays 32-o1, 32-o2, 32-o3, and that incoming off-axis rays 34-i1, 34-i2, 34-i3, 36-i1, 36-i2, 36-i3 are only slightly shifted relative to their respective outgoing rays 34-o1, 34-o2, 34-o3, 36-o1, 36-o2, 36-o3 while maintaining their initial angles quite closely.

CODE V was used to optimize the paraxial cloak to bring the center of the angled rays closer to where they should be located. Specifically, only the curvature of the center mirror ($r_3$) was optimized to obtain the improvement shown in FIG. 5. Although the size of the ray bundles entering the system ("entrance pupil") was the same, the required minimum diameter of the last lens was reduced by over 20 mm. The range of incident angles that the resulting optical cloak can accept ("field-of-view") was −3.5 degrees to +3.5 degrees.

The results in each of FIG. 4 and FIG. 5 show some shifts in the positions of the off-axis rays. It is easy to conclude that this result may be due to the use of the small angle paraxial approximation. A close examination shows that the transverse shifts are different for different incident angles. This suggests that the paraxial cloak is not rotationally symmetric. This may be because the center mirror has a non-zero focusing power and a tilt, simultaneously.

Rotationally Symmetric Improvement

Typically, the ABCD ray tracing matrices assume rotational symmetry since only y is used, instead of both x and y. The paraxial cloak 30 of FIG. 3, however, is not rotationally symmetric. The rotational symmetry of the paraxial cloak 30 can be improved. For example, the center mirror 3 can be replaced with focusing lenses 2', 3' and a flat mirror 3" to result in a paraxial cloak 40 illustrated in FIG. 6. The ABCD matrix for the resulting paraxial cloak 40 is given by equation (13).

$$\begin{bmatrix} 1 & 0 \\ 1/f_5 & 1 \end{bmatrix} \cdot \begin{bmatrix} 1 & -t_4 \\ 0 & 1 \end{bmatrix} \cdot \begin{bmatrix} 1 & t'_3 \\ 0 & 1 \end{bmatrix} \cdot \begin{bmatrix} 1 & 0 \\ -1/f'_3 & 1 \end{bmatrix} \cdot \begin{bmatrix} 1 & t_3 \\ 0 & 1 \end{bmatrix}. \quad (13)$$

$$\begin{bmatrix} 1 & -t'_2 \\ 0 & 1 \end{bmatrix} \cdot \begin{bmatrix} 1 & 0 \\ 1/f'_2 & 1 \end{bmatrix} \cdot \begin{bmatrix} 1 & -t_2 \\ 0 & 1 \end{bmatrix} \cdot \begin{bmatrix} 1 & t_1 \\ 0 & 1 \end{bmatrix} \cdot \begin{bmatrix} 1 & 0 \\ -1/f_1 & 1 \end{bmatrix}$$

In addition to replacing the center mirror, a selected focal length $f_1$ is for lens 1 is used and a corresponding solution for t1 is found. This was done because it is usually easier to purchase a ready-made lens and then adjust the spacing, rather than the other way around. Setting A=−1 and C=0 yields equation (14) for $t_1$.

$$t_1 = [f_1(f'_2 - t'_2) + f'_2(t_2 + t'_2) - t_2 t'_2]/(f'_2 - t'_2). \quad (14)$$

With t1 set to equation (14), the ABCD matrix for the paraxial cloak 40 is given by equation (15).

$$\begin{bmatrix} -1 & (2f_1[f'^2_2 + f_1(f'_2 - t'_2)])/f'^2_2 \\ 0 & -1 \end{bmatrix}. \quad (15)$$

Similar as for the paraxial cloak 30 of FIG. 3, the focal length of lens 2' can be solved. B is set equal to −L' where the total length L' is given by equation (16).

$$L' = 2(t_1 - (t_2 + t_2')\sin(2\alpha - 3\pi/2)). \qquad (16)$$

Solving for the focal length of the second lens 2' yields equation (17).

$$f_2' = -\frac{f_1^2 \pm \sqrt{f_1^2(f_1^2 + 4f_1 t_2' + 2t_2' L')}}{2f_1 + L'}. \qquad (17)$$

Only equations (14) and (17) need to be satisfied for the paraxial cloak 40. Equations (14) and (17), however, form transcendental equations because L' is a function of $t_1$ (equation (16)). At this point, t1 and the focal length of the second lens 2' can be solved for numerically.

It is important to note that the equations above assume that all the lenses are infinitely thin. In reality, lenses have thicknesses, and this can make a large difference in obtaining the correct solutions for equation (5). Hence, further steps can be taken to correct equations (14) and (17) for the use of 'thick' lenses.

Figure 7:
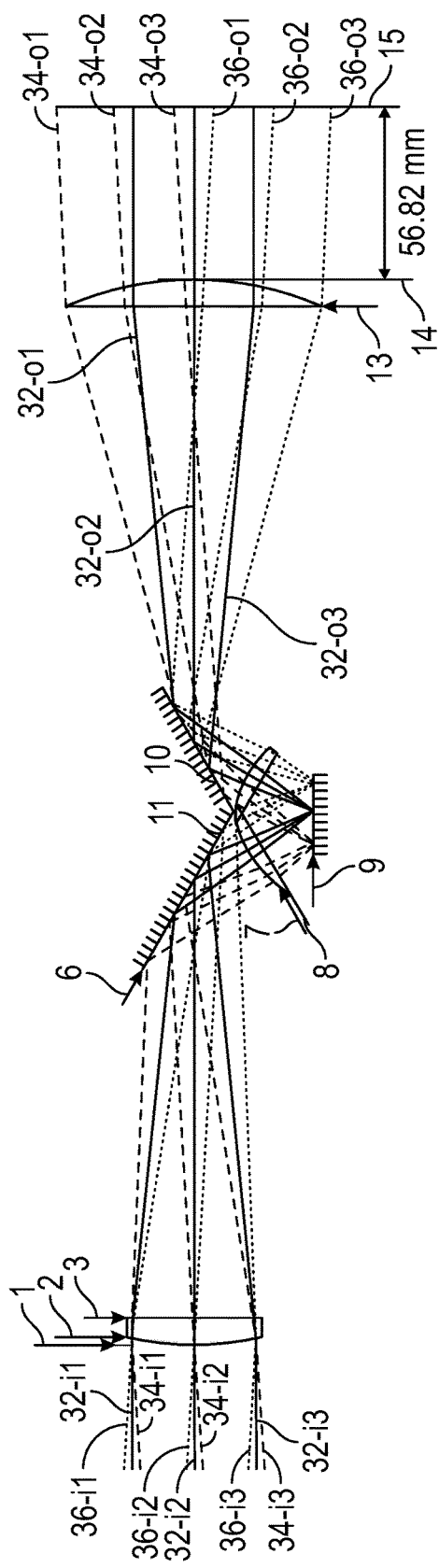
FIG. 7 illustrates a ray tracing assessment performed on a cloaking device in accordance with the cloaking device of FIG. 6.

As an example, a simulation was run for the paraxial cloak 40. The simulation was run using CODE V to accomplish ray tracing. The result is shown in FIG. 7. The field-of-view was the same as for the paraxial cloak 30 of FIG. 3 (−3.5 to +3:5 degrees), but the entrance pupil was increased to 40 mm. Increasing the entrance pupil allows more light to enter, which improves the resolution and 'speed' of the optical system. Even without any separate CODE V optimization, a large improvement is seen over the paraxial cloak 30 simulation results shown in FIG. 4. The rays are closer to where they need to be, and the size of the rays exiting the system has not increased much even compared to optimized paraxial cloak simulation results shown in FIG. 5.

Figure 8:
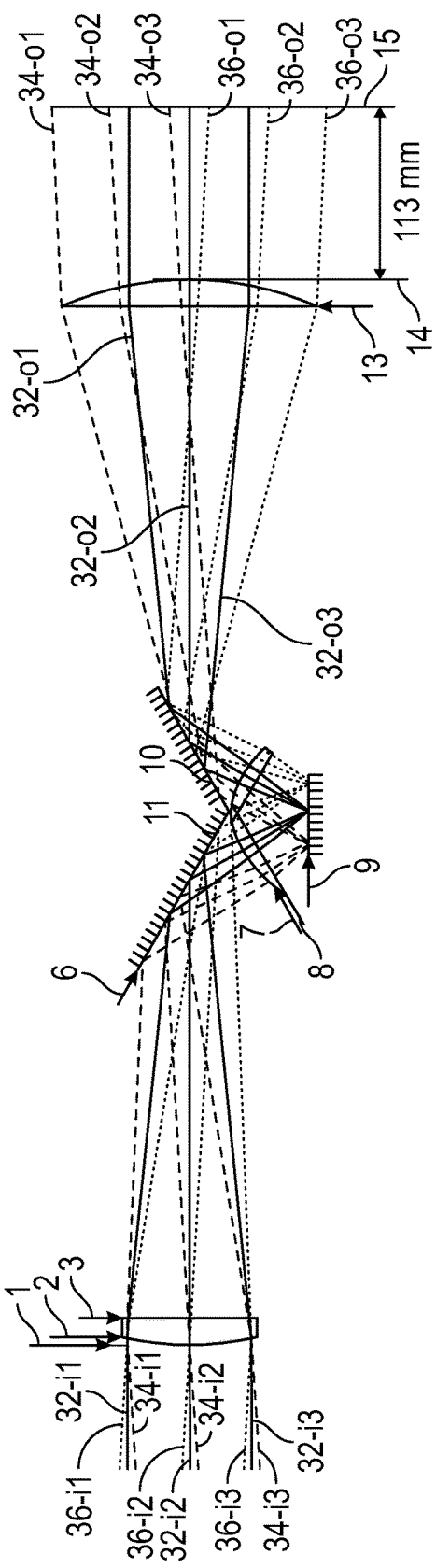
FIG. 8 illustrates a ray tracing assessment performed on a scaled version of the cloaking device of FIG. 7.

The paraxial cloak 40 (or any other paraxial cloak described herein) can be scaled to any suitable size by scaling all radii of curvature, lengths, and entrance pupil by the same factor. For example, the simulation results shown in FIG. 8 are for a doubling of the size of the paraxial cloak 40, which results in a doubling of the corresponding cloaking space.

Figure 6:
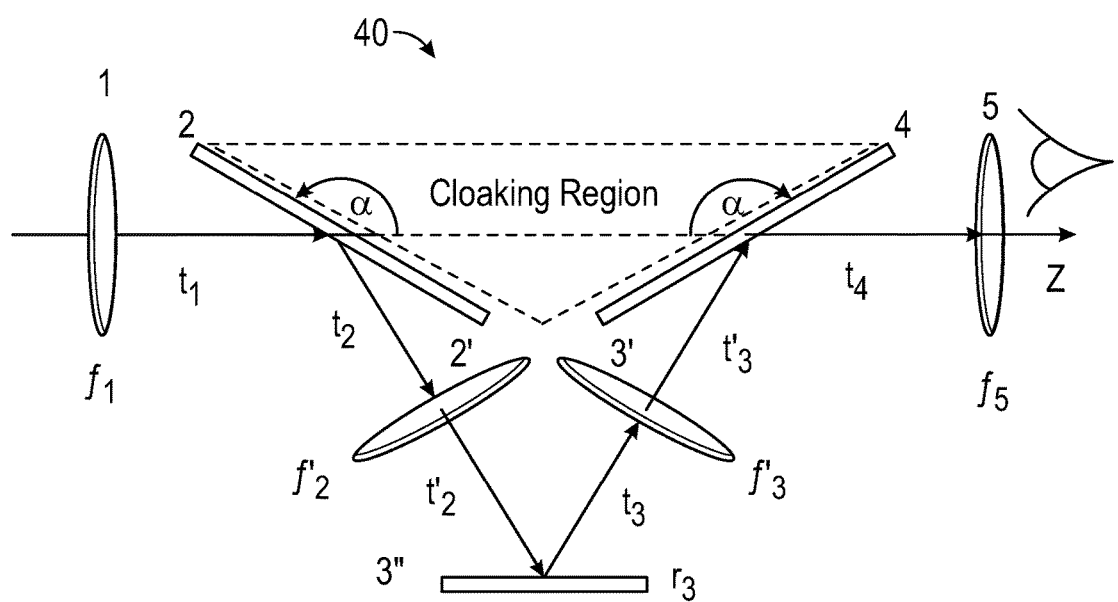
FIG. 6 is a simplified diagrammatic illustration of a paraxial cloaking device having a rotationally symmetric improvement, in accordance with some instances.
Figure 30:
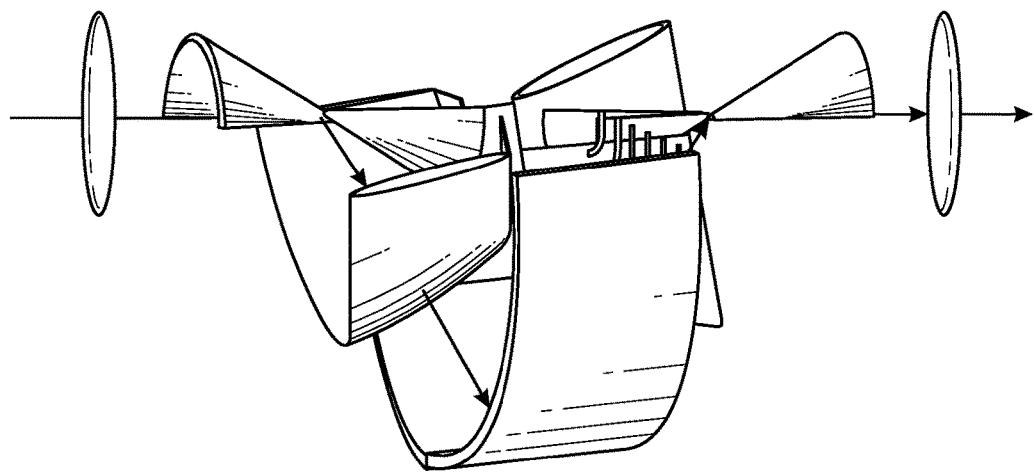
FIG. 30 is a simplified diagram of a three-dimensional adaptation of the two-dimensional cloak shown in FIG. 6.

The paraxial cloak 40 works for multiple off-axis rays in two-dimensions. For three-dimensions, the device can be manufactured with each layer replicating this two-dimensional design throughout a full 180 degrees, rotating about the dotted line connecting the centers of lenses 1 and 5, as seen in FIG. 6. Mirrors 2 and 4 will be shaped similar to bowties (two half-cones attached), mirror 3 will be shaped as a half-pipe, lenses 1 and 5 will remain spherical, and lenses 2' and 3' will be clipped, half-cone shapes with varying thicknesses across. This is shown in FIG. 30.

Rotationally Symmetric Paraxial Cloaks with Lenses

Rotationally symmetric paraxial cloaks are described herein that utilize three thin lenses and four thin lenses, respectively. We will assume the cloaks are in air, for these cases. The ABCD matrix for one thin lens is given by equation (18), where f is the focal length of the lens.

$$\begin{bmatrix} A & B \\ C & D \end{bmatrix}_{thin\ lens} = \begin{bmatrix} 1 & 0 \\ -1/f & 1 \end{bmatrix}. \qquad (18)$$

It can be seen that equation (18) will satisfy equation (5) only if f=+/−infinity, i.e., the lens has no optical power (e.g., a flat lens). Such a lens, however, provides no cloaking region and no optical effect.

Figure 9:
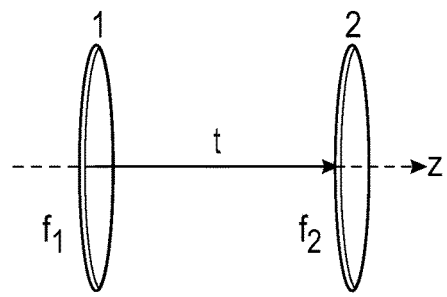
FIG. 9 is a simplified diagrammatic illustration of a two lens device.

Instead, attention is now turned to multiple lens systems. In the following derivations, f's are used to denote the focal lengths, and t's are used to denote the distances between the optical elements. Starting with a two lens system as shown in FIG. 9, the ABCD matrix is given by equation (19).

$$\begin{bmatrix} 1 & 0 \\ -1/f_2 & 1 \end{bmatrix} \cdot \begin{bmatrix} 1 & t \\ 0 & 1 \end{bmatrix} \cdot \begin{bmatrix} 1 & 0 \\ -1/f_1 & 1 \end{bmatrix} = \qquad (19)$$
$$\begin{bmatrix} 1 - t/f_1 & t \\ -(f_1 + f_2 - t)/(f_1 f_2) & 1 - t/f2 \end{bmatrix}.$$

Similar to the one lens system, it can be seen that equation (19) will satisfy equation (5) only if $f_1 = f_2 = +/-$infinity. This is a system that is essentially made of air only, quite literally, again with no cloaking region nor optical effect.

Figure 10:
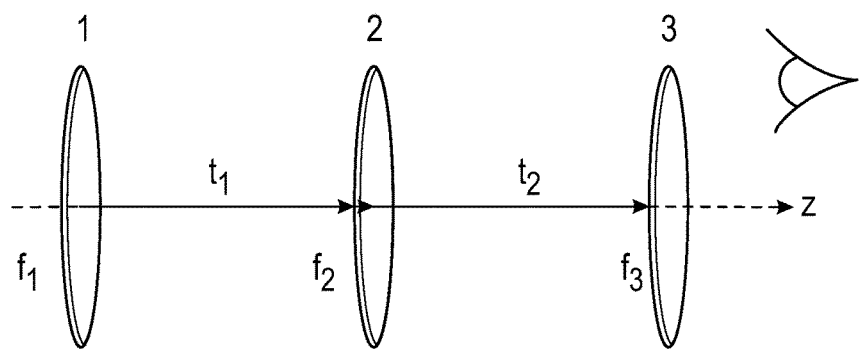
FIG. 10 is a simplified diagrammatic illustration of a rotationally-symmetric three lens paraxial cloaking device, in accordance with some instances.

Turning now to a three lens system as shown in FIG. 10, the ABCD matrix is given by equation (20).

$$\begin{bmatrix} 1 & 0 \\ -1/f_3 & 1 \end{bmatrix} \cdot \begin{bmatrix} 1 & t_2 \\ 0 & 1 \end{bmatrix} \cdot \begin{bmatrix} 1 & 0 \\ -1/f_2 & 1 \end{bmatrix} \cdot \begin{bmatrix} 1 & t_1 \\ 0 & 1 \end{bmatrix} \cdot \begin{bmatrix} 1 & 0 \\ -1/f_1 & 1 \end{bmatrix}. \qquad (20)$$

Setting C=0 and solving for $f_2$ yields equation (21).

$$f_2 = -\frac{(f_1 - t_1)(f_3 - t_2)}{f_1 + f_3 - t_1 - t_2}. \qquad (21)$$

Using equation (21), the ABCD matrix is given by equation (22).

$$\begin{bmatrix} \frac{f_3(f_1 - t_1)}{f_1(f_3 - t_2)} & t_1 + t_2 + t_1 t_2 \frac{(f_1 + f_3 - t_1 - t_2)}{(f_1 - t_1)(f_3 - t_2)} \\ 0 & \frac{f_1(f_3 - t_2)}{f_2(f_1 - t_1)} \end{bmatrix}. \qquad (22)$$

Setting B=t1+t2 yields equation (23).

$$t_1 t_2 \frac{(f_1 + f_3 - t_1 - t_2)}{(f_1 - t_1)(f_3 - t_2)} = 0. \qquad (23)$$

Equation (23), however, is only true if $t_1 = 0$, or $t_2 = 0$, or if $(f_1 + f_3 - t_1 - t_2) = 0$. The first two cases give the two lens system, which cannot be a paraxial cloak as shown above. The last case makes $f_2 \to$infinity, which also turns this system into a two lens system.

Although a three lens system cannot be an ideal cloak, it can asymptotically approach one. For simplicity, considering the case with symmetric halves ($f_1 = f_3$ and $t_1 = t_2$) produces equation (24) from equation (21) and equation (25) from equation (23).

$$f_2 = (t_1 - f_1)/2, \qquad (24)$$

$$2t_1^2/(f_1 - t_1) = 0. \qquad (25)$$

Thus, for $f_1 \gg t_1$, both equation (24) and equation (25) can be satisfied in the limit. Accordingly, a practical three lens paraxial cloaking device can be constructed, for example, such as discussed herein.

Figure 11:
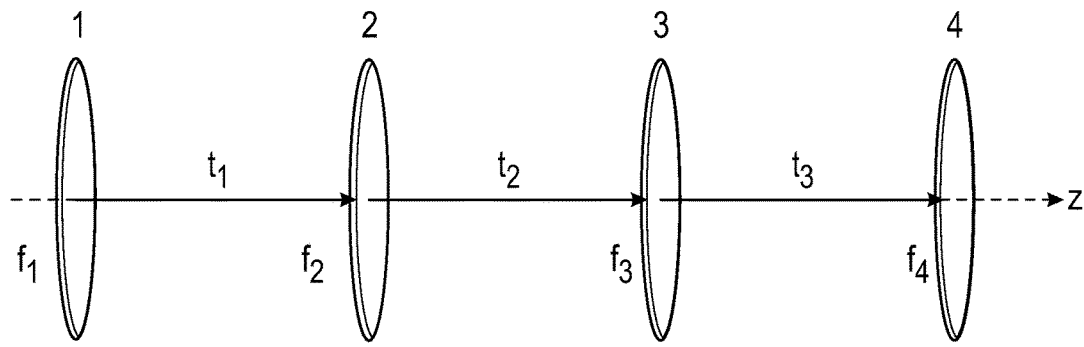
FIG. 11 is a simplified diagrammatic illustration of a rotationally-symmetric four lens paraxial cloaking device, in accordance with some instances.

Turning now to a four lens system as shown in FIG. 11. By making the second half of the system symmetric to the first half ($f_1=f_4$, $f_2=f_3$, and $t_1=t_3$), any changes in the path of rays that occur in the first half might be undone in the second half which is a possible strategy to make the device appear absent. Both A=1 and C=0 for such a four lens ABCD matrix can be satisfied by equation (26).

$$t_1 = f_1 + f_2. \tag{26}$$

With equation (26), the ABCD matrix for the four lens system is given by equation (27).

$$\begin{bmatrix} 1 & f_1(-2t_1^2 + f_1(2t_1 + t_2))/(f_1 - t_1)^2 \\ 0 & 1 \end{bmatrix}. \tag{27}$$

Setting $B = (2 t_1 + t_2)$ and solving for $t_2$ yields equation (28).

$$t_2 = 2f_2(f_1 + f_2)/(f_1 - f_2). \tag{28}$$

Thus, an exact solution for equation (5) can be found for a rotationally symmetric lens-only system, using at least four lenses. Using equation (26) and equation (28), the total length of the four lens system is given by equation (29).

$$L = 2t_1 + t_2 = 2f_1(f_1+f_2)/(f_1-f_2)/(f_1-f_2). \tag{29}$$

Figure 12:
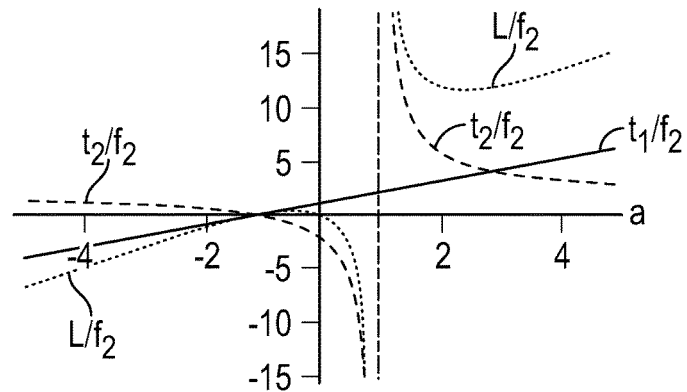
FIG. 12 shows a plot of parameters for possible four lens, rotationally-symmetric, paraxial cloaking devices, in accordance with some instances.

FIG. 12 shows a plot of $t_1/f_2$ (solid line), $t_2/f_2$ (dashed line), and $L/f_2$ (dotted line) as a function of the unit-less parameter $a=f_1/f_2$ on the horizontal axis from equations (26), (28), and (29), for all possible symmetric, four lens, ideal paraxial cloaks, for $a=f_1/f_2$ between −5 and 5 (since these values satisfy equation (5) mathematically). However, even if a device matches the $t_1$, $t_2$, and/or L for a given $a=f_1/f_2$ value, this does not guarantee it to be an ideal cloak since the physical feasibility and presence of a non-empty cloaking region must be checked separately. Additionally, it can be seen that when $f_1 \to -f_2$, the system approaches a one lens system ($t_1=t_2=L=0$). The two extrema for L occur when equation (30) is satisfied.

$$f_1 = (1 \pm \sqrt{2})f_2. \tag{30}$$

Although these and other solutions may satisfy equation (5) mathematically, checks should be made to ensure that any particular solution contains a non-empty cloaking region and is physically feasible, for it to be a valid cloaking device.

Example Three Lens Cloak

Figure 13A:
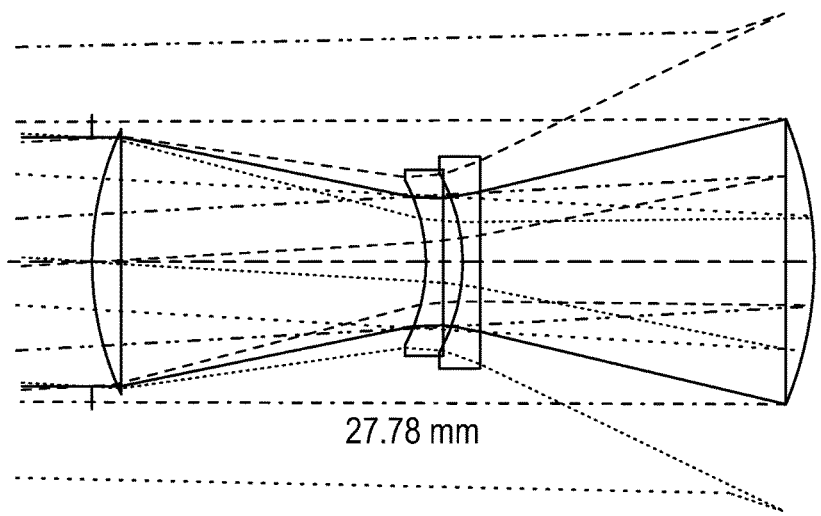
FIG. 13A and FIG. 13B illustrate a ray tracing assessment performed on an example three lens paraxial cloaking device.
Figure 13B:
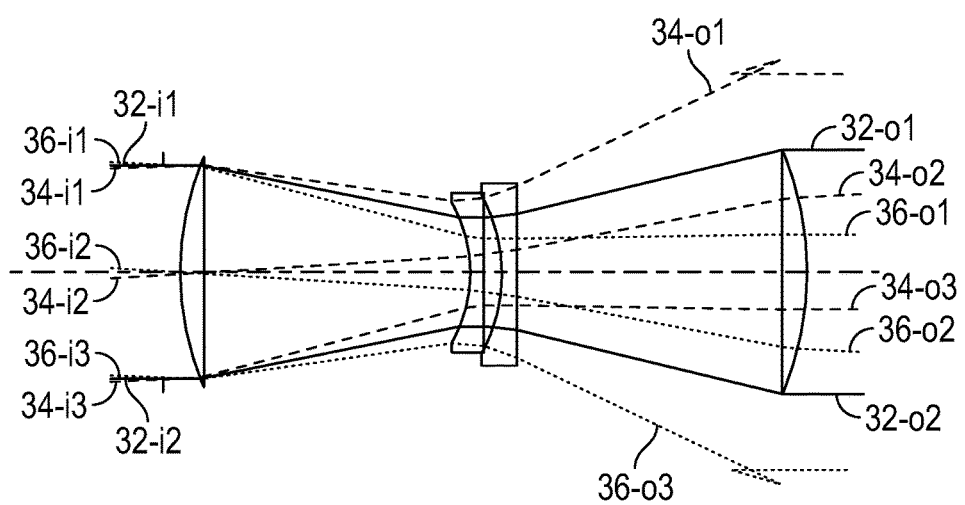
Figure 14:
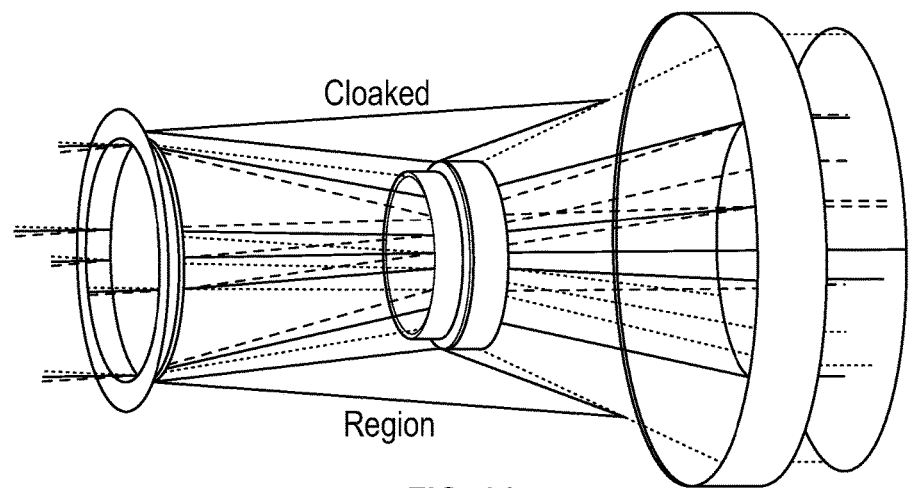
FIG. 14 illustrates a cloaked region for the example three lens paraxial cloaking device of FIG. 13.
Figure 15:
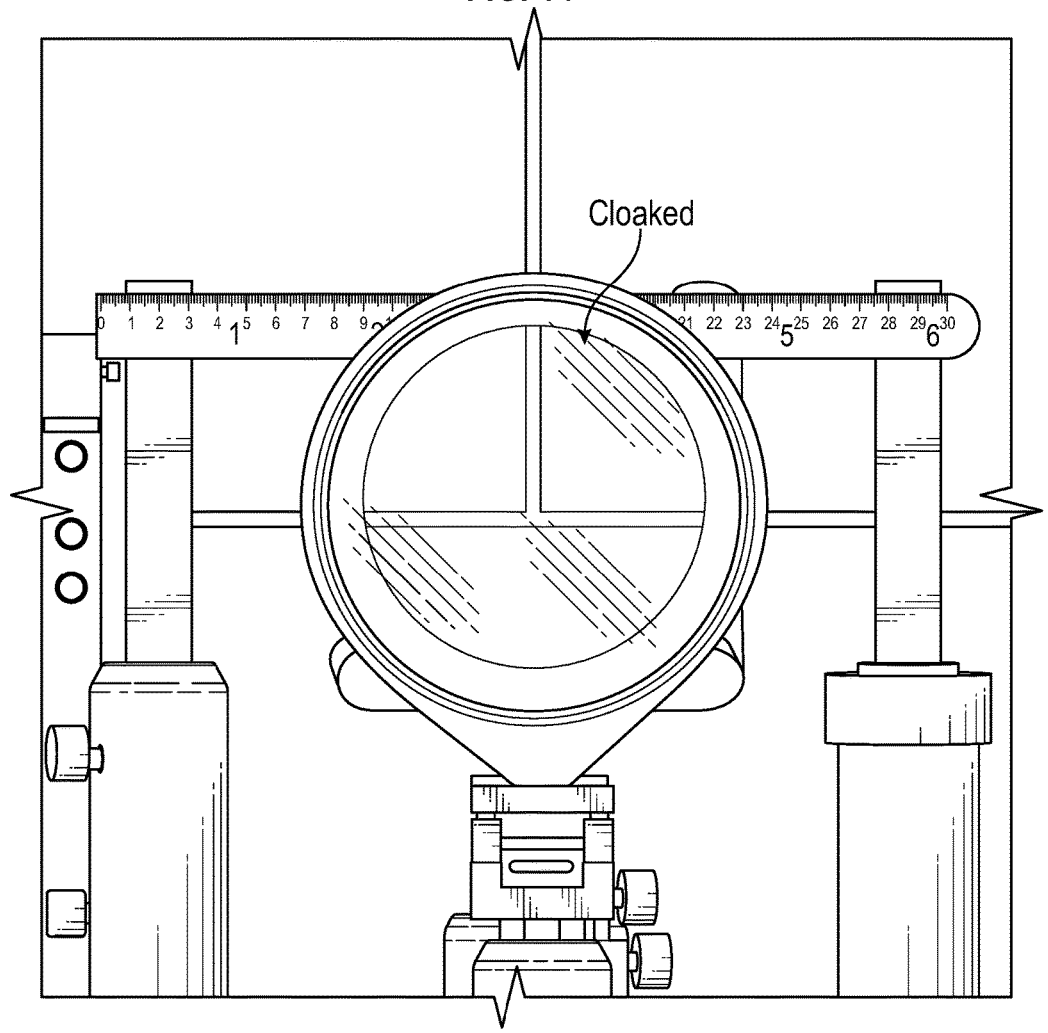
FIG. 15 shows an image taken from an on-axis viewpoint looking through a prototype three lens paraxial cloaking device, in accordance with some instances.
Figure 16:
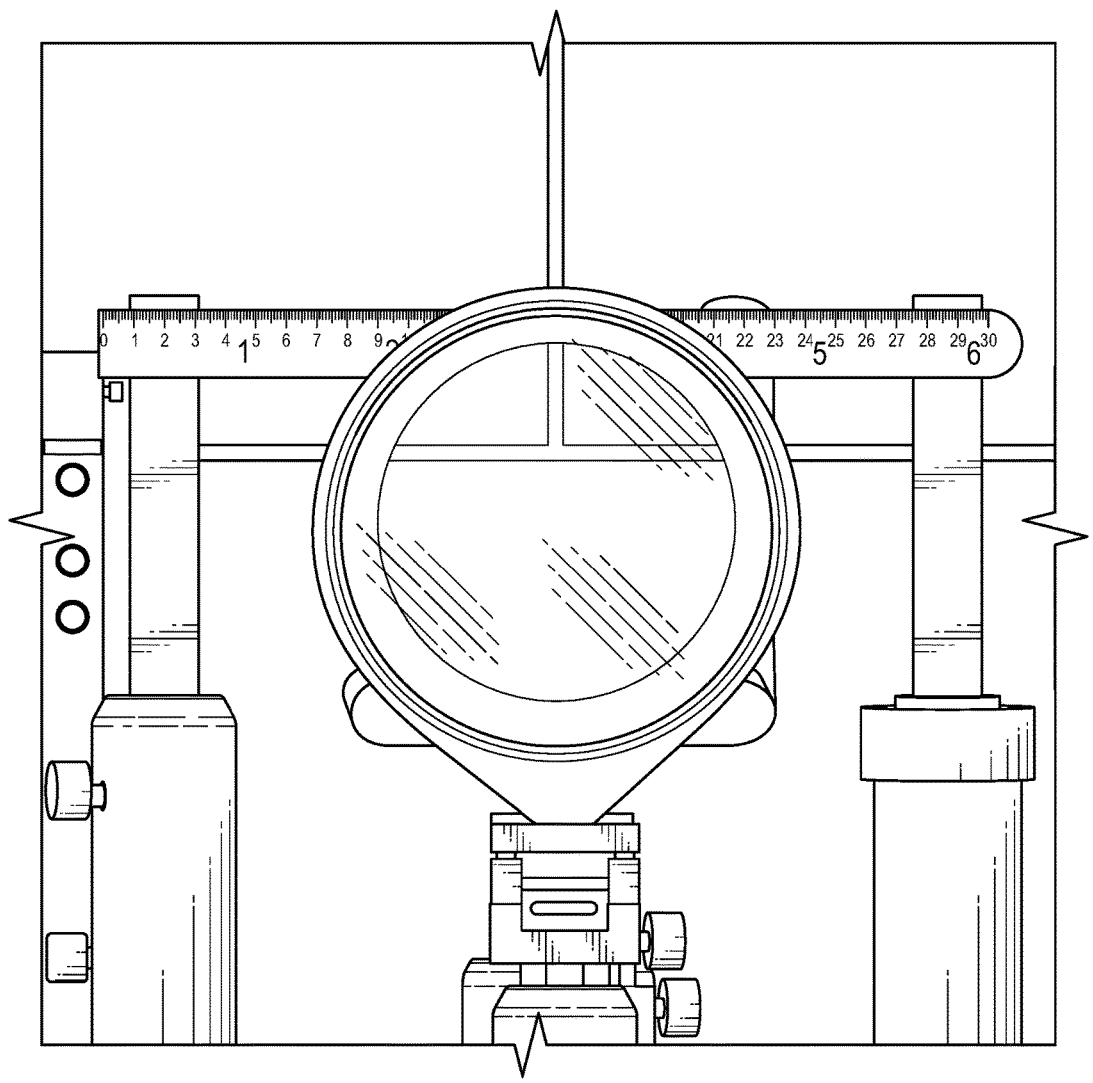
FIG. 16 shows an image taken from an off-axis (0.55 degrees) viewpoint looking through the prototype three lens paraxial cloaking device of FIG. 15.
Figure 17:
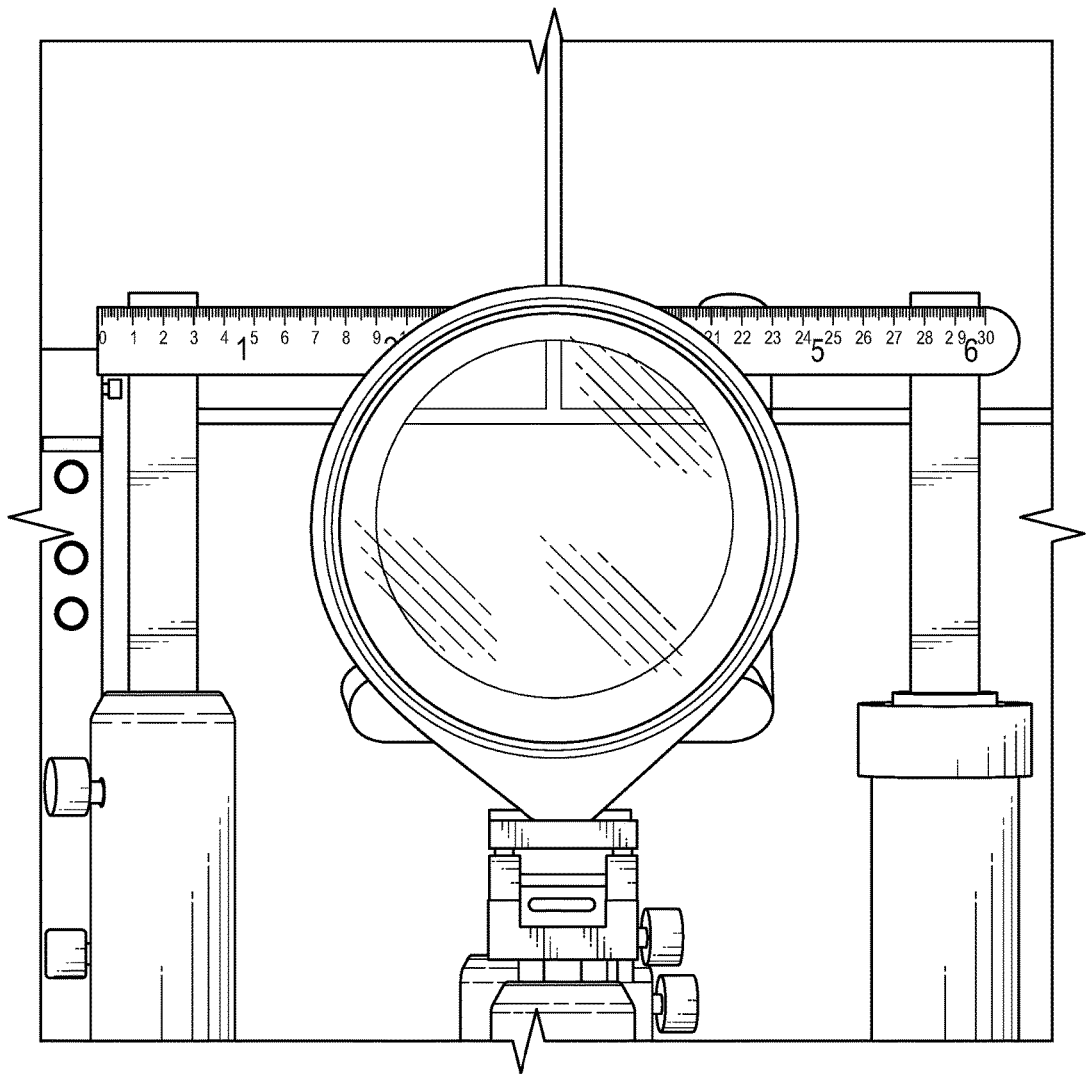
FIG. 17 shows an image taken from an off-axis (0.83 degrees) viewpoint looking through the prototype three lens paraxial cloaking device of FIG. 15.
Figure 18:
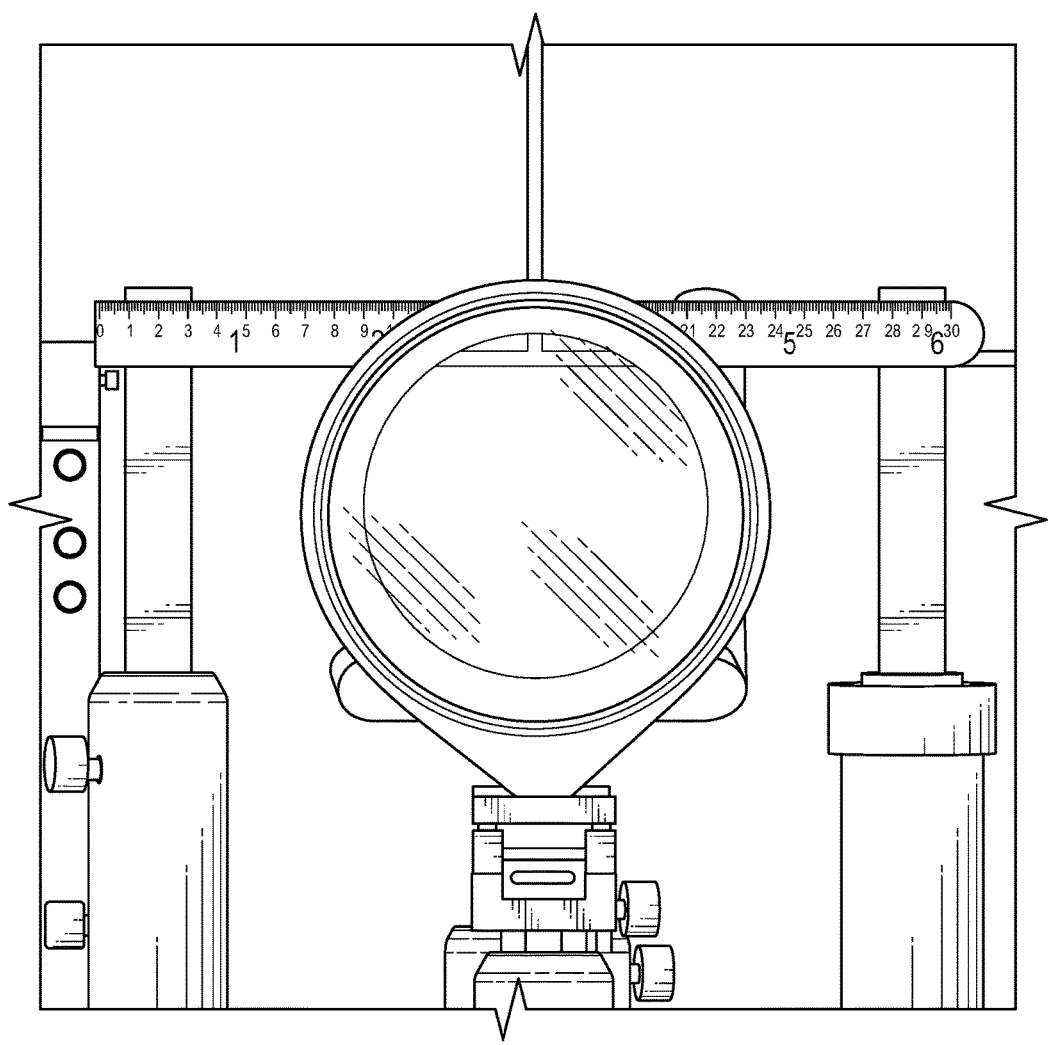
FIG. 18 shows an image taken from an off-axis (1.11 degrees) view point looking through the prototype three lens paraxial cloaking device of FIG. 15.

The cloaking region for the lens designs described herein depend on what incident angles, or "field-of-view," are allowed. To assess the size of the cloaking space, ray-trace simulations using CODE V were performed. First, referring to FIG. 13A, FIG. 13B, and FIG. 14, a three lens cloak with symmetric left and right halves was simulated. As described above, a three lens system approaches an ideal paraxial cloak as its length goes to zero. The size of the ray bundle entering the system ("entrance pupil") was set to the first lens diameter in our experimental setup (75 mm). The field-of-view is −3.5 degrees to +3.5 degrees. The cloaking region is between the lenses and is the ring-shaped region where no rays pass. FIG. 13A and FIG. 13B compare the final image rays to the original rays near the first lens. For an ideal cloak, these rays would overlap. It can be seen that the angles are similar, and the transverse shifts are not too large. FIG. 13B shows: (1) incoming on-axis rays 32-$i$1, 32-$i$2 and respective outgoing on-axis rays 32-$o$1, 32-$o$2; (2) incoming off-axis rays 34-$i$1, 34-$i$2, 34-$i$3 and corresponding respective outgoing off-axis rays 34-$o$1, 34-$o$2, 34-$o$3; and (3) incoming off-axis rays 36-$i$1, 36-$i$2, 36-$i$3 and corresponding respective outgoing off-axis rays 36-$o$1, 36-$o$2, 36-$o$3.

Figure 19:
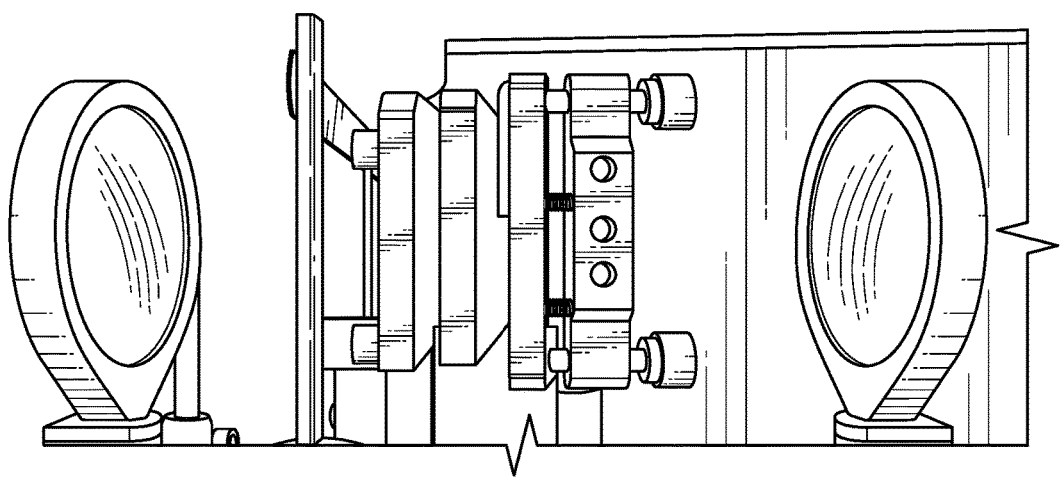
FIG. 19 shows a side profile image of three lens paraxial cloak of FIG. 15.

Plano-convex and plano-concave lenses were used for the three lens cloak. FIGS. 15 through 19 shows images taken during an experimental demonstration in which an object (a wall) was located approximately 2 m from the closest lens in the back. The camera used to take the images was located 5.3 meters away from the front lens and optically zoomed in by 21× (the maximum magnification of the camera). The images were taken from on-axis (FIG. 15—0 degrees), 0.55 degrees off-axis (FIG. 16), 0.83 degrees off-axis (FIG. 17), and 1.11 degrees off-axis (FIG. 18), by increasing the height of the camera. A ruler was placed near the center diverging lenses. It can be seen that the middle of the ruler is cloaked. Also, the lines of the wall as seen through the cloaking device match the background wall as seen outside of the cloaking device, as expected for a good cloak. FIG. 19 shows a side image of the three lens system experimental prototype.

Example Three Lens Cloak Parameters

For the first and last lenses (1 and 3) 200 mm focal length, BK7, 75 mm diameter lenses were used. For the center lens, two −100 mm focal length, BK7, 50 mm diameter lenses were used, back-to-back, to create a lens with focal length of approximately −50 mm. All lenses were catalogue optics from Edmund Optics. From equation (24), $t_1=t_2$ equals approximately 100 mm was obtained. Including the lens thicknesses and the material indices of refraction, $t_1$ was optimized slightly so that the afocal condition C=0 was closely achieved. Diameter of last lens needs to be >150 mm for all rays to pass (no "vignetting"). For the CODE V simulation, the apertures were not restricted to the actual lens sizes. The aperture stop was the first surface. Aperture diameter sizes (for no vignetting) of the first and second diverging lenses in the center are 54 mm and 61 mm, respectively. Total length of the system is 219 mm.

Example Four Lens Cloak

Figure 20:
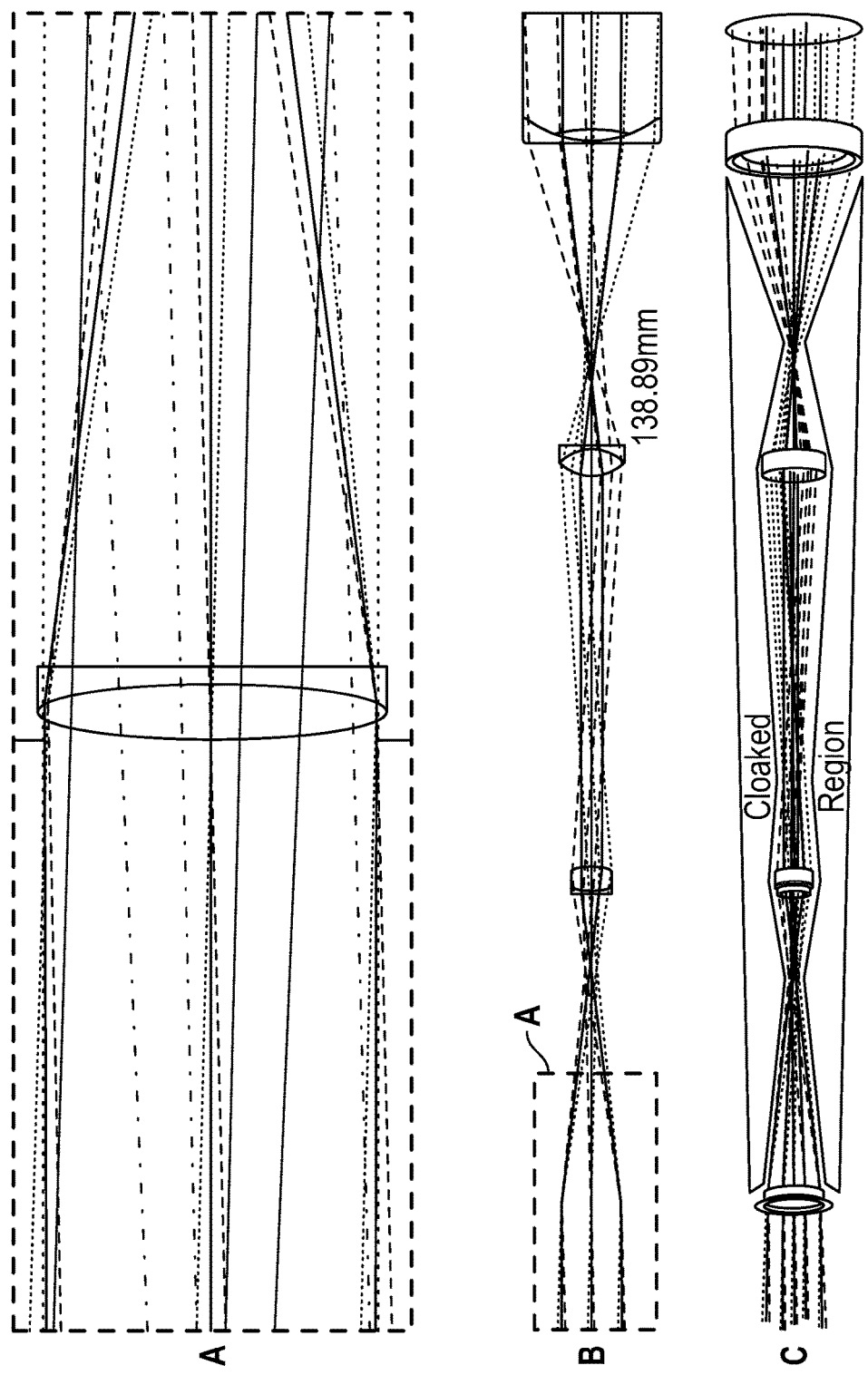
FIG. 20 illustrates a ray tracing assessment performed on an example four lens paraxial cloaking device.

A four lens 'ideal' paraxial cloak that has symmetric left and right halves was simulated. Because real lens systems produce aberrations that can blur and distort the observed image, 'achromatic doublets,' which combine two lenses as one, were used to correct for chromatic and other aberrations. Equations (26) and (28) were corrected and $t_1$, $t_2$, and $t_3$ ($t_1=t_3$) were calculated. FIG. 20 shows the results of a simulation that used these calculated paraxial values without any additional optimization. The resulting cloaking region is an elongated cylinder between the lenses where the rays are not present.

Figure 21:
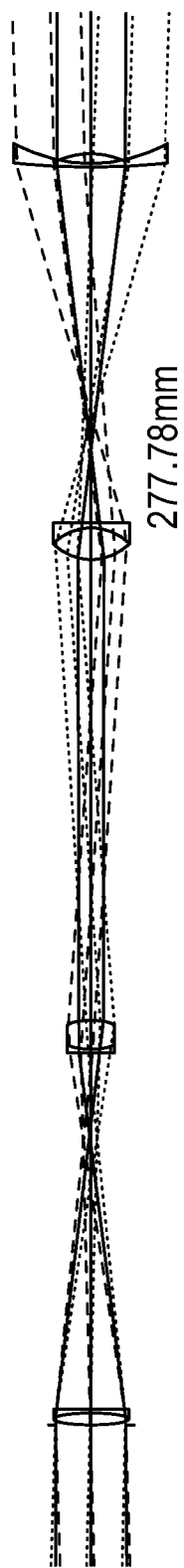
FIG. 21 shows ray tracing simulation results on a four lens paraxial cloak that has been scaled up to twice the size of the four lens paraxial cloak of FIG. 20.

As stated above, the cloaking systems disclosed herein are scalable. For example, a four lens cloak can be scaled to any suitable size by scaling all radii of curvature, lengths, and entrance pupil by the same factor. FIG. 21 shows ray tracing simulation results on a four lens paraxial cloak that has been scaled up to twice the size of the four lens paraxial cloak of FIG. 20, thereby obtaining double the cloaking space.

A prototype four lens cloak was constructed using achromatic doublets to reduce aberrations. Photographs of this prototype paraxial cloak are shown in FIGS. 22 through 26.

Figure 22:
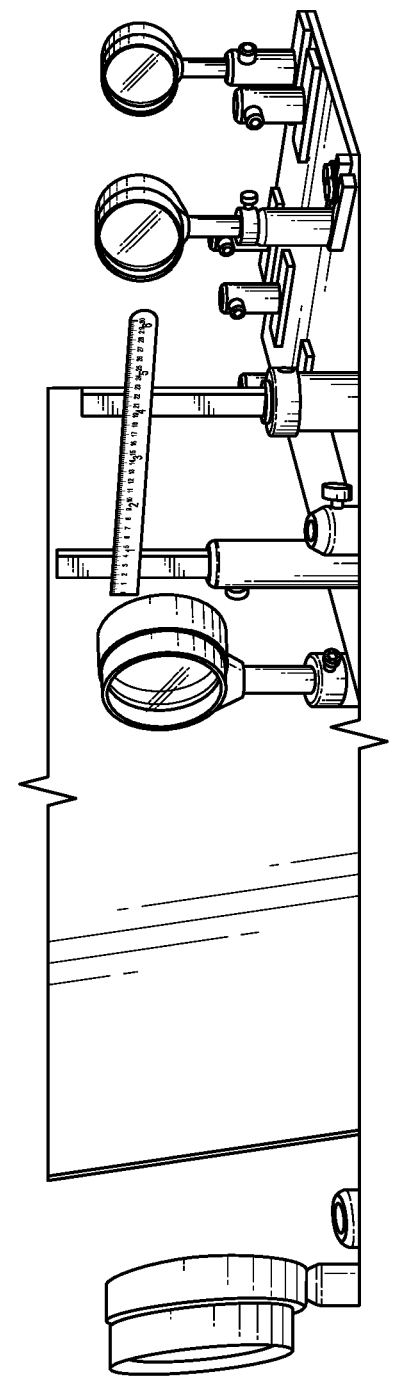
FIG. 22 shows a side profile image of a prototype four lens paraxial cloak.
Figure 23:
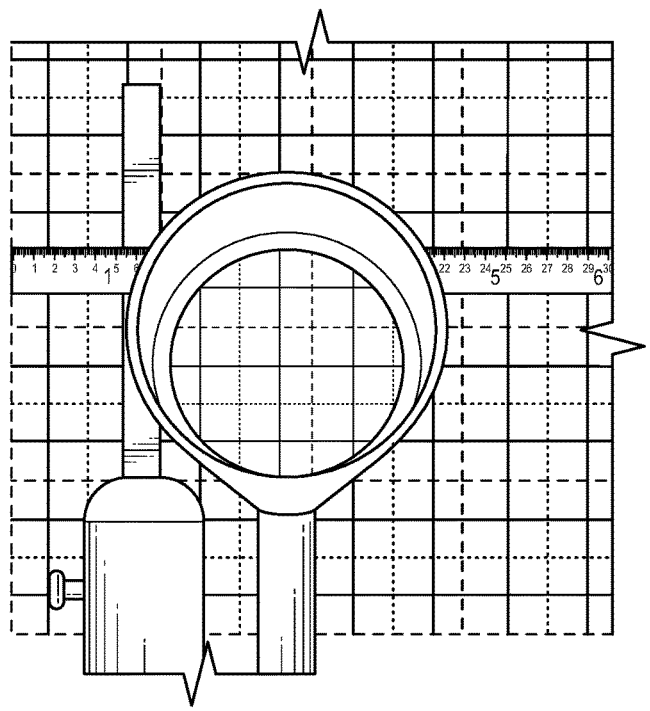
FIG. 23 shows an image taken from an off-axis (−0.65 degrees) viewpoint looking through the prototype four lens paraxial cloaking device of FIG. 22.
Figure 24:
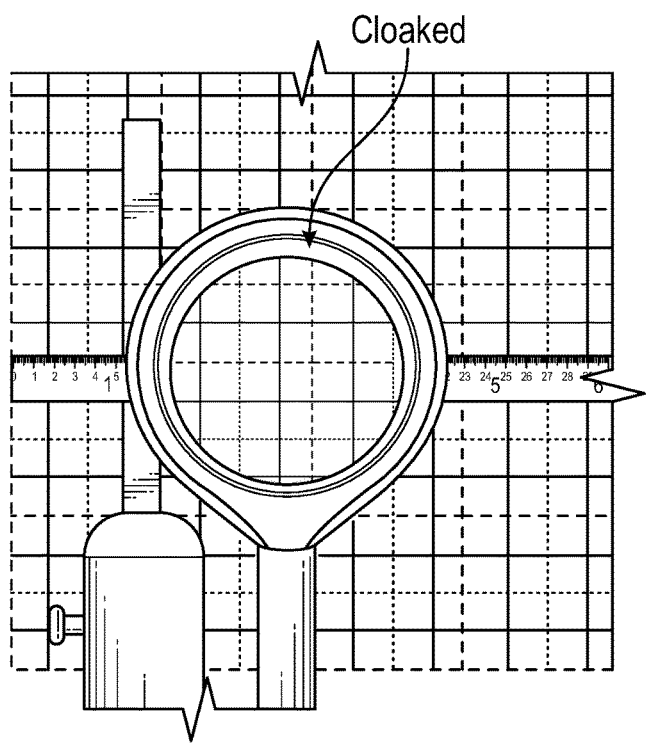
FIG. 24 shows an image taken from an on-axis (0.0 degrees) viewpoint looking through the prototype four lens paraxial cloaking device of FIG. 22.
Figure 25:
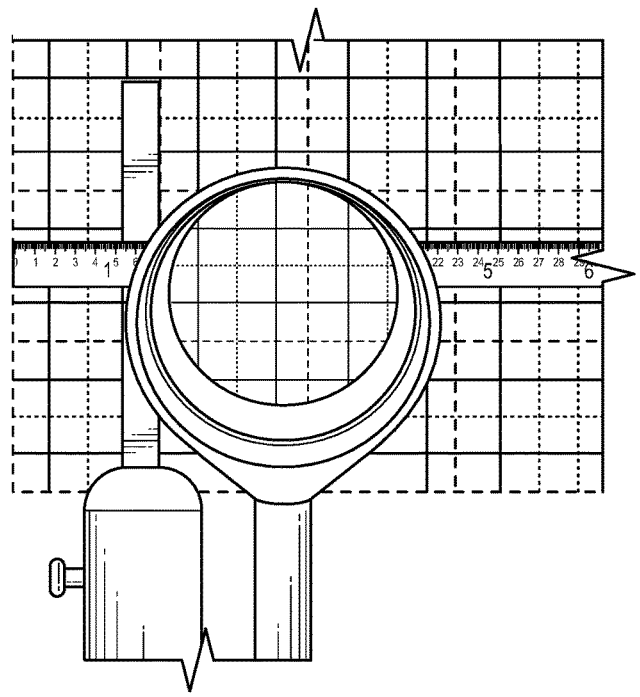
FIG. 25 shows an image taken from an off-axis (0.47 degrees) viewpoint looking through the prototype four lens paraxial cloaking device of FIG. 22.
Figure 26:
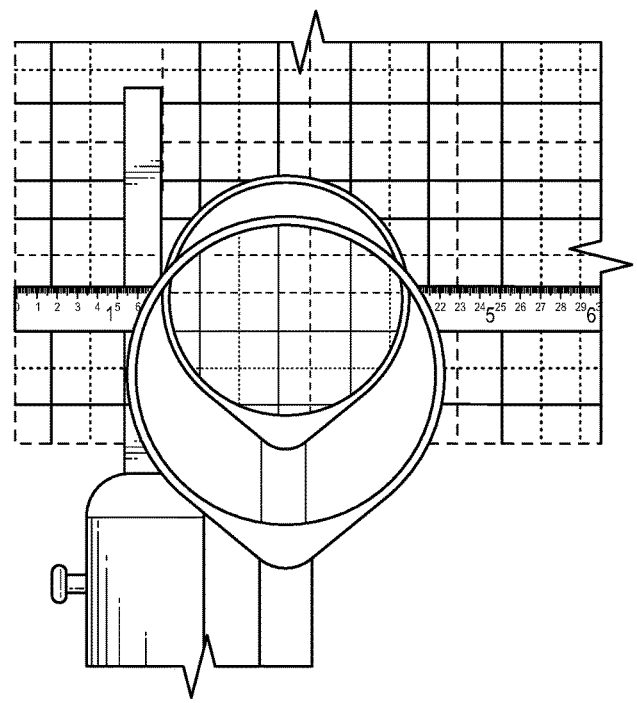
FIG. 26 shows an image taken from an off-axis (0.95 degrees) viewpoint looking through the prototype four lens paraxial cloaking device of FIG. 22.

FIG. 22 shows a side profile view of the prototype four lens cloaking device. The grids on the wall were 1.9 m from the closest lens to the back. The camera was 3.1 m away from the front lens, but optically zoomed in by 21×. The images were taken from −0.65 degrees off-axis (FIG. 23), on-axis (FIG. 24), at 0.47 degrees off-axis (FIG. 25), and 0.95 degrees off-axis (FIG. 26) viewing angles, by changing the height of the camera. A ruler was placed behind the second doublet from the front. The middle of the ruler is cloaked near the center of the device. In particular, the grids on the wall are clear for all colors, have minimal distortion, and match the shifts of the background grids for all the angles.

Example Four Lens Cloak Parameters

For the first and last lenses (1 and 4), 200 mm focal length, 50 mm diameter achromatic doublets composed of BK7 and SF2 glasses were used. For the center two lenses (2 and 3), 75 mm focal length, 50 mm diameter achromatic doublets composed of SF11 and BAF11 glasses were used. All doublets were off-the-shelf catalogue optics from Thorlabs and had antireflection coating in the visible spectrum. For the CODE V simulations, the aperture sizes were not restricted, so as to ensure no vignetting. The aperture stop was the first surface. Diameters of the second, third, and last doublets need to be >33 mm, 51 mm, and 112 mm, respectively, for no vignetting. Total length of the system is 910 mm.

Extending Paraxial Cloaking to Include the Full Field

Figure 32:
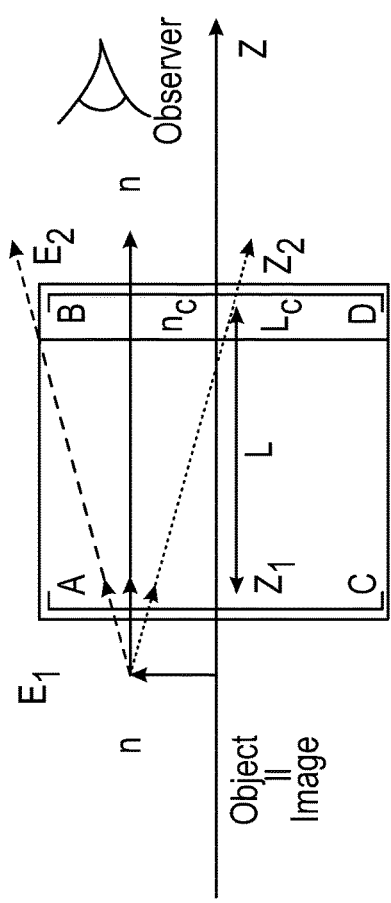
FIG. 32 is a simplified diagrammatic illustration of a paraxial cloaking device, in accordance with some instances.

We now discuss non-limiting examples of paraxial cloaks that work for the full-field (matched amplitude and phase). FIG. 32 schematically shows one example of a full field paraxial cloak. In FIG. 32, the image from the cloaking device is the same as the object. Propogation of light rays can be described by an 'ABCD' matrix. n is the index of refraction of the ambient medium. L is the longitudinal length of the device along the center z-axis. $E_1$ and $E_2$ are the input and output fields, respectively, at $z=z_1$ and $z_2$. In this example, phase matching is achieved with a flat plate with index $n_c$ and length $L_c$.

In some instances, the examples of paraxial full-field cloaking described in this section satisfy all but the omnidirectionality of an 'ideal' cloaking device. In some instances, this 'paraxial' formalism can work for up to +/−30°, which is quite practical for many cases where the cloaked object is not placed immediately before an observer. Although we discuss below the propagation of a monochromatic field, since an arbitrary field of light can be written as a linear superposition of monochromatic waves, our systems extend to broadband without loss of generality.

Duan et al. recently provided phase matching with their unidirectional cloaking system based off of geometric optics (see R. Duan, E. Semouchkina, and R. Pandey, "Geometric optics-based multiband cloaking of large objects with the wave phase and amplitude preservation," Optics Express 22, 27193-27202 (2014)). They provided a heuristic reason why rays that pass through the edge of their optical system may match the phase of those rays that pass through the center instead, for their particular setup with split lenses. They then simulated phase-matched cloaking for discretely separated micro-waves to mm-waves. Here, we provide for and analytically show phase matching for general paraxial optical systems, including continuously multidirectional cloaking systems. Embodiments of our phase matching systems utilize formula given by Siegman and others (see A. E. Siegman, Lasers (University Science Books, Sausalito, C A, 1986)), for propagation of any paraxial field through a generalized paraxial optical system. The resulting formula is proved using Fermat's principle and Huygens' integral, by accounting for the optical path lengths of all rays.

Field propagation based off of Huygens' principle of wavelet propagation, is effective and widely used in diffraction theory and Fourier optics. We first assume that the ambient medium is spatially uniform with index of refraction n, and that the optical system of interest is rotationally symmetric for simplicity (so can be described by a 2×2 ABCD matrix) (see FIG. 32). Non-uniform medium or non-rotationally symmetric systems are also envisioned, and can be derived from here.

For rotationally symmetric two-dimensions, and no limiting apertures, Huygens' integral in the Fresnel (or, paraxial) approximation is given by equation (31) (see S. A. Collins, "Lens-system diffraction integral written in terms of matrix optics," J. Opt. Soc. Am. 60, 1168-1177 (1970)):

$$\tilde{E}_2(x_2, y_2) = \frac{ie^{-ik_0 L_0}}{B\lambda_0} \int\int_{-\infty}^{\infty} \tilde{E}_1(x_1, y_1) \exp \qquad (31)$$
$$\left\{-i\frac{\pi}{B\lambda_0}[A(x_1^2+y_1^2) - 2(x_1 x_2 + y_1 y_2) + D(x_2^2 + y_2^2)]\right\} dx_1 dy_1.$$

In equation (31), A, B, C, D are the coefficients of the ABCD matrix. $L_0 = \Sigma_i n_i L_i$ is the on-axis optical path length, where each ith optical element has index of refraction $n_i$ and physical thickness $L_i$ along the longitudinal, center axis (z). $\lambda_0$ and $k_0$ are the wavelength and wavevector in free space. $\tilde{E}_1$, $\tilde{E}_2$ are the complex, spatial amplitude of the input ($z=z_1$) and output ($z=z_2$) field distributions, respectively ($E_1$, $E_2$ in FIG. 32, but without the $e^{+i\omega t}$ harmonic time dependence).

In some of the embodiments described in previous sections, we stated that an 'ideal' cloaking device simply replicates the ambient medium throughout its volume, and so its ABCD matrix is given by equation (32):

$$\begin{bmatrix} A & B \\ C & D \end{bmatrix}_{ideal\ cloak} = \begin{bmatrix} 1 & L/n \\ 0 & 1 \end{bmatrix}. \qquad (32)$$

Thus, the propogated field for an 'ideal' full-field cloak is given by equation (33):

$$\tilde{E}_2^{cloak}(x_2, y_2) = \frac{ine^{-ik_0 nL}}{L\lambda_0} \int\int_{-\infty}^{\infty} \tilde{E}_1(x_1, y_1) \exp \qquad (33)$$
$$\left\{-i\frac{n\pi}{L\lambda_0}[(x_1^2+y_1^2) - 2(x_1 x_2 + y_1 y_2) + (x_2^2 + y_2^2)]\right\} dx_1 dy_1.$$

A ray optics cloak embodiment satisfies equation (32). By comparing equations (31) and (33), we then see that a ray optics cloak can be a full-field cloak if $e^{-ik_0 L_0} = e^{ik_0 nL}$, which may be the case when $k_0 L_0 = k_0 nL$ (absolute phase matching), or when $L_0 \equiv nL \pmod{\lambda_0}$ (phase-matching to integer multiples of $2\pi$). The significance of these conditions is that they allow for phase-matched, full field cloaking for any incoming fields within the paraxial approximation. In some embodiments, the phase-matching condition only needs to be satisfied once for a given optical system, and then all ray directions and positions, or any field distribution ($\tilde{E}_1$) will exit if traversed through a cloaked ambient space. Note that a ray optics cloak (equation (32)) will usually be phase-matched to integer multiples of $2\pi$ with a full-field cloak for multiple, but discretely separated, wavelengths automatically. However, we can do better and match it for a continuous, broad bandwidth by satisfying the phase-matching to integer multiples of $2\pi$ condition with appropriate dispersion control.

One method for broadband phase matching is to add a thin, flat plate to a ray optics cloak, anywhere between the background object(s) and the observer. Since it is "thin" and flat, the original ABCD matrix (equation (32)) will be unchanged and only the $e^{-ik_0L_0}$ factor outside the integral of equation (31) will be affected. Let $L'=\Sigma_{i=1}^{N} L_i$ be the total length of the original ray optics cloak (so $L=L_c+L'$), where N is the number of original optical elements. So $L_0 \to n_c L_c + \Sigma_{i=1}^{N} n_i L_i$ in Eq. (31), and $nL \to n(L_c+L')$ in Eq. (33). Here, $n_i$, $L_i$ are the index of refraction and physical longitudinal length, respectively, for the $i^{th}$ optical element, and $n_c$, $L_c$ are likewise for the correcting thin plate. It may be shown that a plate is "thin" when $|L_c/L'|<<1$ and $|L_c/L'|<<|n_c/n|$. With our phase-correcting plate, the phase-matching to integer multiples of $2\pi$ condition is rearranged to write the dispersion relation of $n_c$:

$$n_c(\lambda_0, m, L_c) = n(\lambda_0) + \frac{1}{L_c}\left\{m\lambda_0 + \sum_{i=1}^{N}[n(\lambda_0) - n_i(\lambda_0)]L_i\right\}. \quad (34)$$

$m \in \mathbb{Z}$ is any integer, with infinite but discrete choices.

Figure 33:
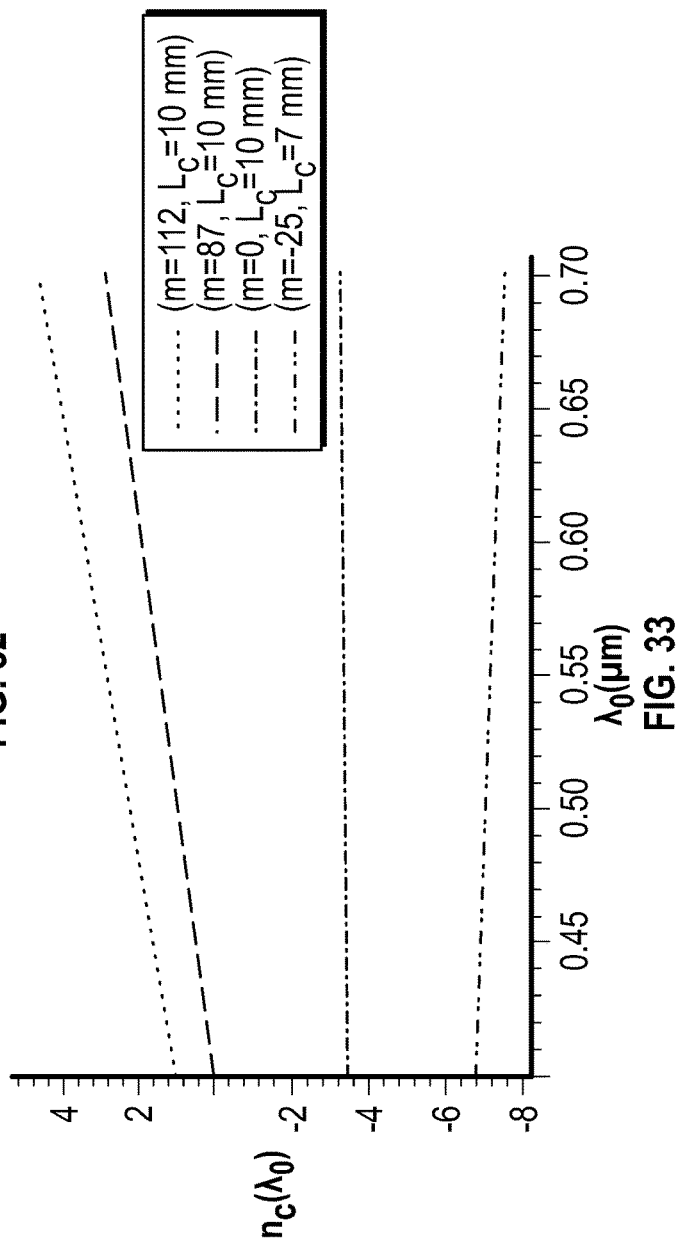
FIG. 33 is a chart of various thin, flat plates that may be used to match a full-field cloak condition in some instances.

There are infinitely many combinations of $L_c$ and in that are possible for $n_c((\lambda_0), m, L_c)$. Ultimately, the choice of which to use should depend on physically realizable $n_c$'s. A few such solutions, that phase-corrects a four lens cloak described in J. S. Choi and J. C. Howell, "Paraxial ray optics cloaking," Optics Express 22, 29465-29478 (2014), are shown in FIG. 33, in which the dispersion relations of the refractive index for these plates are shown for various values of m and $L_c$ (mm) from Eq. (34), in air. In this example, for simplicity, we assumed that the cloaking system is placed in air, with $n=n_{air}=1$ for all wavelengths, and we ignored any coatings. The lens coatings can be modeled as additional thin plates as needed. We also only consider the visible spectrum (400-700 nm, for our discussion). A thicker compensating flat plate can reduce the required dispersion range, but this also affects the imaging quality, so we have purposely limited its thickness for this particular example.

Many of the solutions for positive refractive indices require anomalous dispersion, as shown in FIG. 33. For the purposes of cloaking, at least in some implementations, such dispersion for broadband spectrum that have low losses are desired to imitate ambient space properly. This is similar to the finite bandwidth cloak made of anisotropic layers, as suggested by Kildishev et al., which also required strong anomalous dispersion combined with loss compensation. Costa and Silveirinha have suggested using nanowire metamaterial to provide such anomalous dispersion, and they numerically calculated their index of refraction to be near 2.9~3.1 for the entire visible spectrum. See J. T. Costa and M. G. Silveirinha, "Achromatic lens based on a nanowire material with anomalous dispersion," Opt. Express 20, 13915-13922 (2012). They can achieve these low loss, broadband, anomalous dispersion properties by utilizing the collective, spatial properties of metamaterials (called 'spatially dispersive' materials). This allows the ability to move beyond the high loss and narrow band properties of typical transparent materials, which stem from the Kramers-Kronig relations. In addition, Theisen and Brown have experimentally demonstrated anomalous dispersion for 500~1,000 nm, with Gallium implanted Silicon pads. These have indices of refraction near 2 or 4, each with variations of about 1 over the spectrum, depending on the doping level.

Negative-index metamaterials are good candidates for phase-correction as well for some implementations. The utilization of metamaterials was to be expected, since we expanded ray optics cloaking to the field cloaking aspect of transformation optics. Much progress is being made, both theoretically and experimentally, for creating negative index materials for broadband optical frequencies. Some examples of refractive index values demonstrated experimentally include between −3 and 0 for microwave frequencies in two-dimensions, n=0.63 at 1,200 nm to n=−1.23 at 1,775 nm in a low loss, 3D bulk material, and n=1 to −7.5 for 1.1-2.4 micron wavelengths.

By relaxing only omnidirectionality for an 'ideal' cloak, we have shown how to match the phase for the whole visible spectrum in some implementations. The phase-matching plate may require negative index metamaterials or anomalous dispersion in some instances, which are broadband and low loss, but current research has shown much progress in this regard. We had shown that building a 3D, broadband, macroscopic cloak, that works for the visible spectrum, can be fairly "easy" for ray optics in the small angle limit, and have extended this to the full-field using recently developed materials. As with typical lens designs, we expect that extending such cloaks to large angles will be possible.

It is interesting to note that the paraxial full-field cloak we presented does not require anisotropy, though being 3D, macroscopic, and broadband. Anisotropy seems to be a requirement when creating an omnidirectional cloak, from a paraxial cloak, not necessarily a property of 3D or field cloaks alone.

Potential Applications

Figure 31:
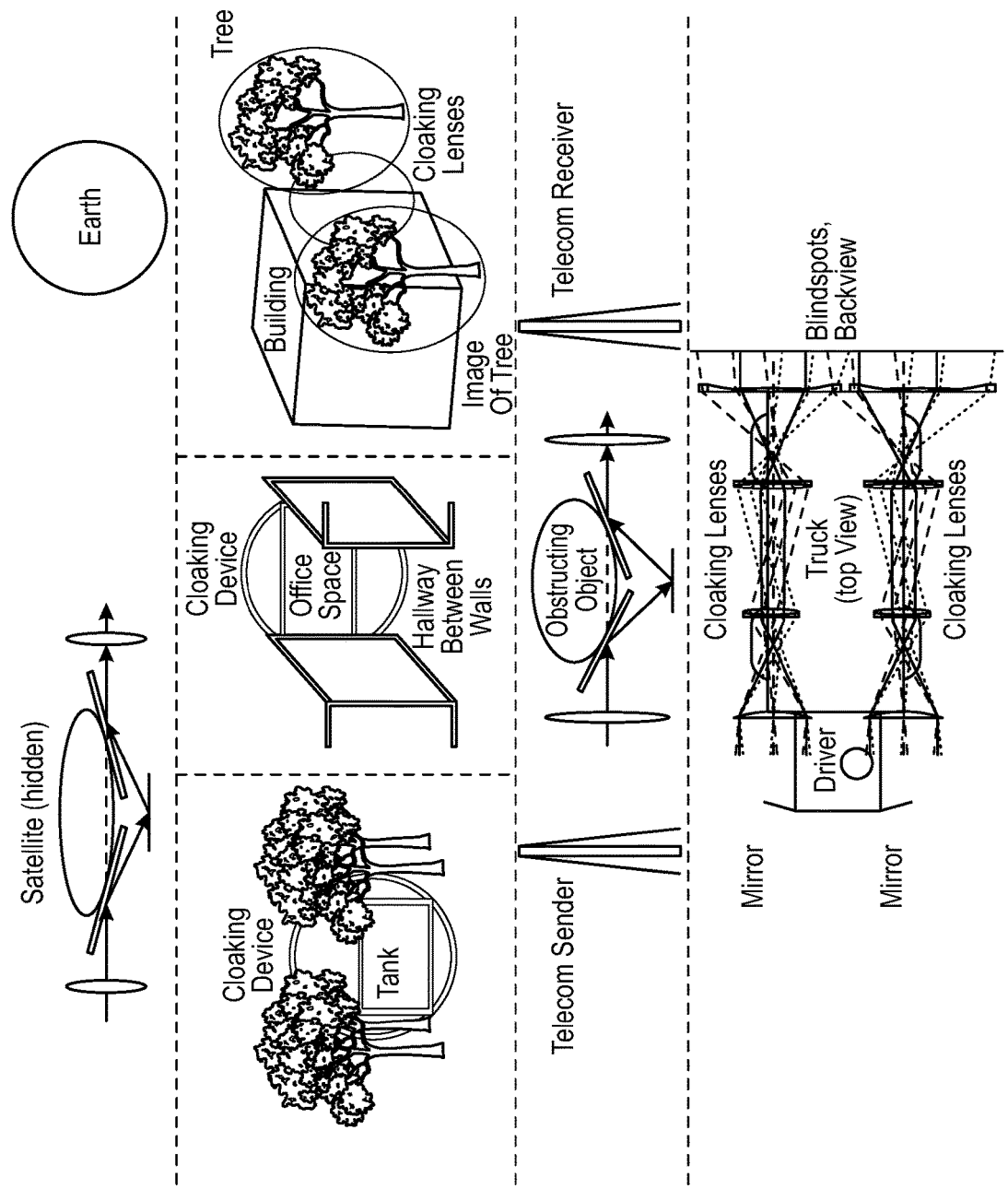
FIG. 31 shows possible applications of cloaking devices.
Figure 31:
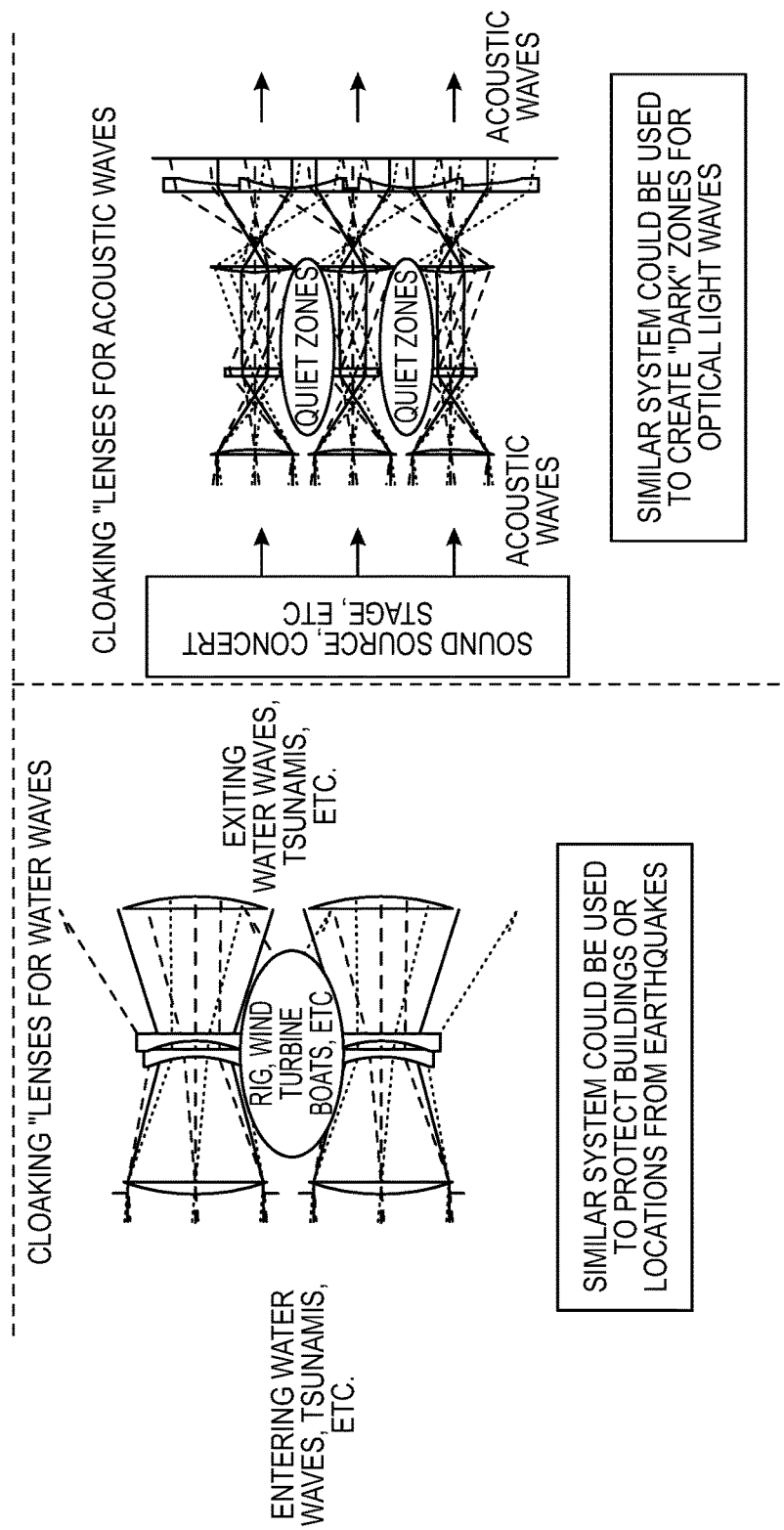

The paraxial cloaking devices and related methods described herein may be applicable in many different fields, for example, such as in communications, transportation, military technologies, and medical devices. Additionally, the paraxial cloaking devices describe herein can alternatively be used to make visible an object that is obscured by another object. For example, a paraxial cloaking device can be used to view an internal organ or tissue that is hidden behind another internal organ or tissue that cannot be moved to make the hidden object directly visible. An enlarged cloaking device could allow portions of a building to be "see-through" on the outside, allow drivers to see directly behind the vehicle even if the space behind the driver is blocked (by objects or people, or the vehicle itself as in the case of semi-trucks), or furniture and objects inside a building to be invisible for interior design effects. A paraxial cloak can also hide a satellite orbiting the earth from a range of viewing angles, as well as a tank flanked by trees on each side, or offices or people on one end of a hallway. Some of these applications are shown in FIG. 31.

In fact, the ABCD matrix for equation (5) can be solved for any waves or "rays" that can be described by similar matrices, to find an ideal "cloaking" device for such "rays." These include seismic waves, sound (acoustic waves), water waves, etc., not just optical rays. A cloaking device for such waves can allow water waves to not damage rigs by effectively cloaking the rigs, reduce damage from tsunamis in likewise manner, or allow certain geographical regions or buildings to not be heavily damaged by earthquakes by diverting the earthquake waves. These and other applications are shown in FIG. 31.

Figure 27:
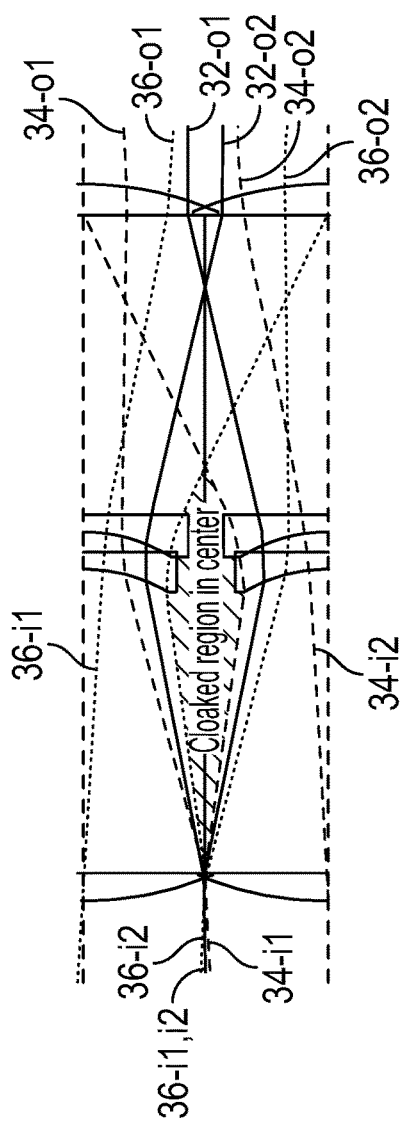
FIG. 27 illustrates a ray tracing assessment performed on an example split three lens paraxial cloaking device.
Figure 28:
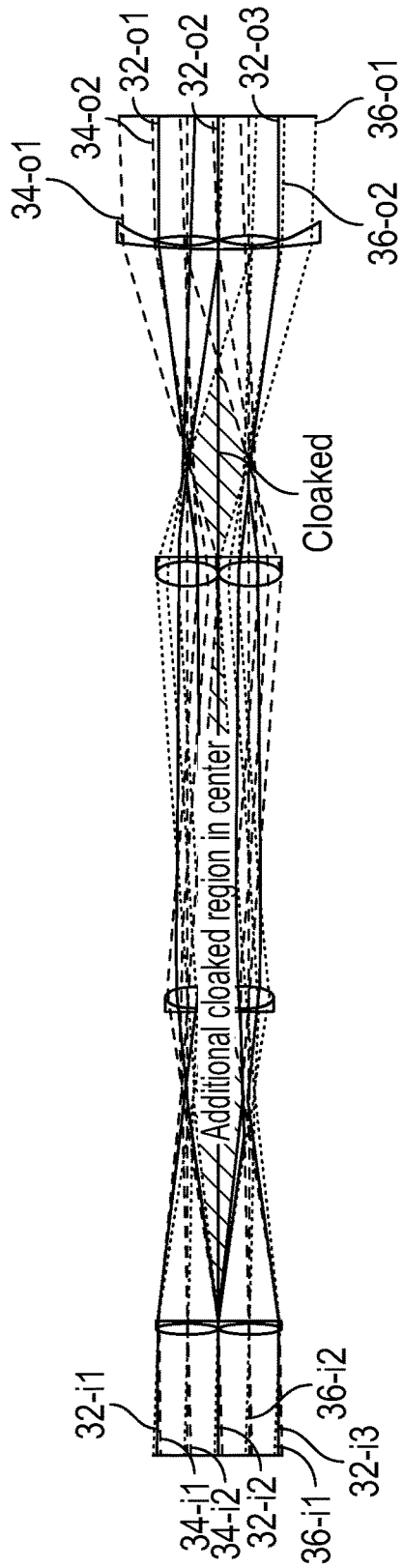
FIG. 28 illustrates a ray tracing assessment performed on an example combined four lens paraxial cloaking device.

Other variations are within the spirit of the present invention. For example, other variations including three and/or four lens cloaks that are split in half and connected the other way, or even combined, so as to make cloaking regions that cloak the center axis region (these can create two-dimensional cloaks, or can be manufactured for three-dimensions by rotating the split or combined lens designs completely around the center axes). FIG. 27 shows CODE V simulation results for a split three lens paraxial cloak. The simulation results show: (1) the path of incoming on-axis rays 32-$i$1, 32-$i$2 and resulting respective outgoing on-axis rays 32-$o$1, 32-$o$2; (2) the path of incoming off-axis rays 34-$i$1, 34-$i$2 and resulting respective outgoing off-axis rays 34-$o$1, 34-$o$2; (3) the path of incoming off-axis rays 36-$i$1, 36-$i$2 and resulting respective outgoing off-axis rays 36-$o$1, 36-$o$2; and (4) a resulting cloaked region in the center of the split three lens paraxial cloak. FIG. 28 shows CODE V simulation results for a combined four lens paraxial cloak. The simulation results show: among other rays, (1) the path of incoming on-axis rays 32-$i$1, 32-$i$2, 32-$i$3 and resulting respective outgoing on-axis rays 32-$o$1, 32-$o$2, 32-$o$3; (2) the path of incoming off-axis rays 34-$i$1, 34-$i$2 and resulting respective outgoing off-axis rays 34-$o$1, 34-$o$2; (3) the path of incoming off-axis rays 36-$i$1, 36-$i$2 and resulting respective outgoing off-axis rays 36-$o$1, 36-$o$2; and (4) resulting cloaked regions in the center of the combined four lens paraxial cloak, as well as the outer region/shell. Equation (5) can also be applied to five lenses or more, or for any optical system with arbitrary number of elements (lenses, mirrors, or anything else that can be described with an ABCD matrix). Also, lenses can be replaced by Fresnel lenses that can be larger, thinner, and lighter, though possibly with lesser image quality than regular lenses and/or achromatic lenses.

Thus, while the invention is susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A paraxial cloaking device having a cloaking volume and a reference optical axis, the device comprising:
   an optical input receiving light rays; and
   an optical output from which a continuous range of directions of the received light rays exit the paraxial cloaking device, the optical output being offset from the optical input, the cloaking volume being disposed between the optical input and the optical output,
   wherein, for the received light rays having incoming directions non-parallel to the reference optical axis up to a first angle, each of the received light rays exits the cloaking device at the optical output substantially aligned with the respective received light ray and does not pass through the cloaking volume,
   wherein the paraxial cloaking device has a unity magnification factor and is afocal.

2. The cloaking device of claim 1, wherein the first angle is 3.5 degrees.

3. The cloaking device of claim 1, wherein the first angle is 5 degrees.

4. The cloaking device of claim 1, wherein the first angle is 15 degrees or more.

5. The cloaking device of claim 1, wherein the cloaking device provides rotationally symmetric cloaking and comprises at least three lenses.

6. The cloaking device of claim 5, wherein each of the three lenses is centered on the reference optical axis.

7. The cloaking device of claim 5, wherein the clocking device comprises four lenses.

8. The cloaking device of claim 7, wherein the four lenses are centered on the reference optical axis.

9. The cloaking device of claim 7, wherein at least one of the four lenses comprises an achromatic doublet.

10. The cloaking device of claim 1, wherein the cloaking device imparts an optical transformation to the received light rays defined by an ABCD matrix, wherein A=1, B=L/n, C=0, and D=1; L being a length between the optical input and the optical output, n being an index of refraction for the surrounding/ambient medium, before and/or after, the cloaking device.

11. The cloaking device of claim 1, comprising:
   a first lens centered on the reference optical axis;
   a first mirror tilted from the reference optical axis;
   a curved second mirror;

a third mirror tilted from the reference optical axis; and
a second lens centered on the reference optical axis,
wherein, the optical input comprises the first lens, the optical output comprises the second lens, and a light ray passing through the cloaking device follows an optical propagation path, the second mirror being disposed along the optical propagation path between the first and second lenses, the first mirror being disposed along the optical propagation path between the first lens and the second mirror, and the third mirror being disposed along the optical propagation path between the second mirror and the second lens.

12. The cloaking device of claim 11, wherein:
the first and second lenses have the same focal length;
the first lens and the first mirror are separated by a distance equal to a distance separating third mirror and the second lens; and
the first mirror and the second mirror are separated a distance equal to a distance separating the second mirror and the third mirror.

13. The cloaking device of claim 1, comprising:
a first lens centered on the reference optical axis;
a first mirror tilted from the reference optical axis;
a second lens;
a second mirror;
a third lens;
a third mirror tilted from the reference optical axis; and
a fourth lens centered on the reference optical axis,
wherein, the optical input comprises the first lens, the optical output comprises the fourth lens, and a light ray passing through the cloaking device follows an optical propagation path, the second mirror being disposed along the optical propagation path between the first and fourth lenses, the first mirror being disposed along the optical propagation path between the first lens and the second mirror, the third mirror being disposed along the optical propagation path between the second mirror and the fourth lens, the second lens being disposed along the optical path between the first and second mirror, and the third lens being disposed along the optical path between the second and third mirrors.

14. The cloaking device of claim 13, wherein:
the first and fourth lenses have the same focal length;
the first lens and the first mirror are separated by a distance equal to a distance separating third mirror and the fourth lens;
the first mirror and the second lens are separated a distance equal to a distance separating the third lens and the third mirror;
the second and third lenses have the same focal length; and
the second lens and the second mirror are separated a distance equal to a distance separating the second mirror and the third lens.

15. A method of designing the cloaking device of claim 1, comprising:
configuring a candidate cloaking device; and
calculating an ABCD matrix for the candidate cloaking device,
wherein the candidate cloaking device is configured such that $A=1$, $B=L/n$, $C=0$, and $D=1$; L being a length between the optical input and the optical output, n being an index of refraction for the surrounding/ambient medium, before and/or after, the cloaking device.

16. The method of claim 15, further comprising adjusting at least one of a parameter or a position of at least one optical component of the candidate cloaking device so as to compensate for a thickness of at least one optical component of the candidate cloaking device.

17. The method of claim 15, further comprising:
tracing at least one ray through the candidate cloaking device to assess a deviation between the location and direction of the ray prior to being received by the candidate cloaking device and after exiting the candidate cloaking device; and
adjusting at least one of a parameter and a position of at least one optical component of the candidate cloaking device based on the deviation assessment so as to reduce the deviation.

18. A method for designing a second cloaking device having a desired cloaking volume, the method comprising:
selecting a first cloaking device in accordance with claim 1;
determining a scale factor indicative of a size difference between the desired cloaking volume and the cloaking volume of the first cloaking device; and
determining configuration parameters of the second cloaking device by scaling corresponding configuration parameters of the first cloaking device by the scale factor.

19. The cloaking device of claim 1, wherein the device does not include a metamaterial optical component.

20. The cloaking device of claim 1, wherein the device does not include a non-isotropic optical component.

21. The cloaking device of claim 1, wherein the device does include a metamaterial optical component.

22. The cloaking device of claim 1, further comprising a phase matching element.

23. The cloaking device of claim 22, wherein the phase matching element comprises a flat plate having at least one index of refraction and a longitudinal length.

24. The cloaking device of claim 23, wherein the phase matching element comprises an anomalous dispersion element.

25. The cloaking device of claim 23, wherein the phase matching element comprises a metamaterial.

26. The cloaking device of claim 25, wherein the index of refraction is at least one negative index of refraction.

27. The cloaking device of claim 1, wherein the optical output comprises a profile and an axis, wherein the received light rays do not travel outside the profile of the optical output when viewed along the axis of the optical output.

28. The cloaking device of claim 1, wherein, for the received light rays having incoming directions non-parallel to the reference optical axis up to the first angle, each of the received light rays exits the cloaking device at the optical output at an angle equal to an angle in which the received light ray entered the cloaking device.

29. The cloaking device of claim 1, wherein, for the received light rays having incoming directions non-parallel to the reference optical axis up to the first angle, each of the received light rays exits the cloaking device at the optical output at a shifted position relative to a position in which the received light ray entered the cloaking device, the shifted position being equal to a tangent of an angle in which the received light ray entered the cloaking device multiplied by a length of the cloaking device.

* * * * *